US010008683B2

(12) United States Patent
Lee et al.

(10) Patent No.: US 10,008,683 B2
(45) Date of Patent: Jun. 26, 2018

(54) FLEXIBLE ORGANIC TRANSISTORS WITH CONTROLLED NANOMORPHOLOGY

(71) Applicant: The Regents of the University of California, Oakland, CA (US)

(72) Inventors: Byoung Hoon Lee, Goleta, CA (US); Alan J. Heeger, Santa Barbara, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 0 days. days.

(21) Appl. No.: 15/213,029

(22) Filed: Jul. 18, 2016

(65) Prior Publication Data
US 2017/0018725 A1    Jan. 19, 2017

Related U.S. Application Data

(60) Provisional application No. 62/193,909, filed on Jul. 17, 2015.

(51) Int. Cl.
*H01L 51/00* (2006.01)
*H01L 51/05* (2006.01)
*G03F 7/00* (2006.01)
*B05D 1/18* (2006.01)
*B05D 1/00* (2006.01)

(52) U.S. Cl.
CPC ........ *H01L 51/0097* (2013.01); *G03F 7/0002* (2013.01); *H01L 51/0012* (2013.01); *H01L 51/0558* (2013.01); *B05D 1/005* (2013.01); *B05D 1/18* (2013.01); *H01L 51/0036* (2013.01); *Y02E 10/549* (2013.01)

(58) Field of Classification Search
CPC ................... H01L 51/0012; H01L 51/0097
See application file for complete search history.

(56) References Cited

U.S. PATENT DOCUMENTS

2004/0178428 A1* 9/2004 Chou ................. H01L 51/0012
257/283
2007/0075365 A1* 4/2007 Mardilovich ..... H01L 29/41733
257/347
2007/0099333 A1* 5/2007 Moriya ............... H01L 51/0012
438/96

OTHER PUBLICATIONS

Virkar, A. Investigating the Nucleation, Growth, and Energy Levels of Organic Semiconductors for High Performance Plastic Electronics. Springer, New York, 2012. (p. 1-26).*
Karakawa, M. et al. High-performance poly(3-hexylthiophene) field-effect transistors fabricated by a slide-coating method. Appl. Phys. Express, 1 (2008) 061802.*

(Continued)

*Primary Examiner* — Matthew Gordon
*Assistant Examiner* — Gardner W Swan
(74) *Attorney, Agent, or Firm* — Gates & Cooper LLP

(57) ABSTRACT

An organic device, including semiconducting polymers processed from a solution cast on one or more dielectric layers on a substrate; and electrical contacts to the semiconducting polymers, wherein the substrate and the one or more dielectric layers are flexible and the semiconducting polymers are aligned. The one or more dielectric layers can increase mobility of the semiconducting polymers and/or alignment of the semiconducting polymers with one or more of the nanogrooves in the dielectric layers.

20 Claims, 14 Drawing Sheets

(56) References Cited

OTHER PUBLICATIONS

Li, L. et al. Growth of ultrathin organic semiconductor microstripes with thickness control in the monolayer precision. Angew. Chem. Int. Ed., 52 (2013) 12530-12535.*

DiBenedetto et. al., "Molecular Self-Assembled Monolayers and Multilayers for Organic and Unconventional Inorganic Thin-Film Transistor Applications", Adv. Mater. 2009, 21, 1407-1433 DOI 10.1002/adma.200803267.

Guo, L. J. "Nanoimprint lithography: Methods and material requirements", Adv. Mater. 19, 495-513 (2007).

Horowitz, G., "Organic field-effect transistors", Adv. Mater. 10, 365-377 (1998).

Jang, J. et al. "Hysteresis-free organic field-effect transistors and inverters using photocrosslinkable poly(vinyl cinnamate) as a gate dielectric", Appl. Phys. Lett. 92, 143306 (2008).

Jang, K.-S. et al. "Surface modification of a polyimide gate insulator with an yttrium oxide interlayer for aqueous-solution-processed zno thin-film transistors", Langmuir 29, 7143-7150 (2013).

Lee, B.H. et. al., "Flexible Organic Transistors with Controlled Nanomorphology", Nano Lett., 2016, 16 (1), pp. 314-319 and associated Supplementary Information.

Lee, E. K. et al. "Photo-crosslinkable polymer gate dielectrics for hysteresis-free organic field-effect transistors with high solvent resistance", RSC Adv. 4, 293-300 (2014).

Letizia, J. A. et al. "Variable temperature mobility analysis of n-channel, p-channel, and ambipolar organic field-effect transistors", Adv. Funct. Mater. 20, 50-58 (2010).

Luo, C. et al. "General strategy for self-assembly of highly oriented nanocrystalline semiconducting polymers with high mobility", Nano Lett. 14, 2764-2771 (2014).

Noriega, R. et al. "A general relationship between disorder, aggregation and charge transport in conjugated polymers", Nat. Mater. 12, 1038-1044 (2013).

Park, S. et al. "Flexible molecular-scale electronic devices", Nat. Nanotechnol. 7, 438-442 (2012).

Perez, L. A. et al. "Effect of backbone regioregularity on the structure and orientation of a donor-acceptor semiconducting copolymer", Macromolecules 47, 1403-1410 (2014).

Roberts, M. E. et al. "Cross-linked polymer gate dielectric films for low-voltage organic transistors", Chem. Mater. 21, 2292-2299 (2009).

Schwartz, G. et al. "Flexible polymer transistors with high pressure sensitivity for application in electronic skin and health monitoring", Nat. Commun. 4, 1859, pp. 1-8 (2013).

Tseng, H.-R. et al. "High-mobility field-effect transistors fabricated with macroscopic aligned semiconducting polymers", Adv. Mater. 26, 2993-2998 (2014).

Tseng, H.-R. et al. "High mobility field effect transistors based on macroscopically oriented regioregular copolymers", Nano Lett. 12, 6353-6357 (2012).

Verploegen, E. et al. "Swelling of polymer dielectric thin films for organic-transistor-based aqueous sensing applications", Chem. Mater. 25, 5018-5022 (2013).

Wu, X. et al. "Thermally stable, biocompatible, and flexible organic field-effect transistors and their application in temperature sensing arrays for artificial skin", Adv. Funct. Mater. 25, 2138-2146 (2015).

Yi, H. T., et al. "Ultra-flexible solution-processed organic field-effect transistors", Nat. Commun. 3, 1259 (2012).

Yoon, J.-Y. et al. "Enhanced performance of solution-processed organic thin-film transistors with a low-temperature-annealed alumina interlayer between the polyimide gate insulator and the semiconductor", ACS Appl. Mater. Interfaces 5, 5149-5155 (2013).

Yoon, M.-H., et al. "Low-voltage organic field-effect transistors and inverters enabled by ultrathin cross-linked polymers as gate dielectrics", J. Am. Chem. Soc. 127, 10388-10395 (2005).

Li, J., et al., "A stable solution-processed polymer semiconductor with record high-mobility for printed transistors", Scientific Reports, Oct. 2012, pp. 1-9, vol. 2.

Sharpe, W.N., et al., "Strain Measurements of Silicon Dioxide Microspecimens by Digital Imaging Processing", Experimental Mechanics, 2007, pp. 649-658, vol. 47.

Cattoni, A., et al., "Soft UV Nanoimprint Lithography: A Versatile Tool for Nanostructuration at the 20nm Scale", DOI: 10.5772/21874, Dec. 2011, pp. 1-19.

Yuan, Y., et al., "Ultra-high mobility transparent organic thin film transistors grown by an off-centre spin-coating method", Nature Communications, 2014, pp. 1-9, vol. 5.

Lan, H., "Soft UV Nanoimprint Lithography and Its Applications", Intech, 2013, pp. 1-28.

Machado, W.S., et al., "Low-Voltage Poly(3-Hexylthiophene)/Poly(Vinyl Alcohol) Field-Effect Transistor and Inverter", IEEE Transactions on Electron Devices, May 2012, pp. 1529-1533, vol. 59, No. 5.

Noh, Y-Y., et al., "Ultra-thin polymer gate dielectrics for top-gate polymer field-effect transistors", Organic Electronics, 2009, pp. 174-180, vol. 10.

* cited by examiner

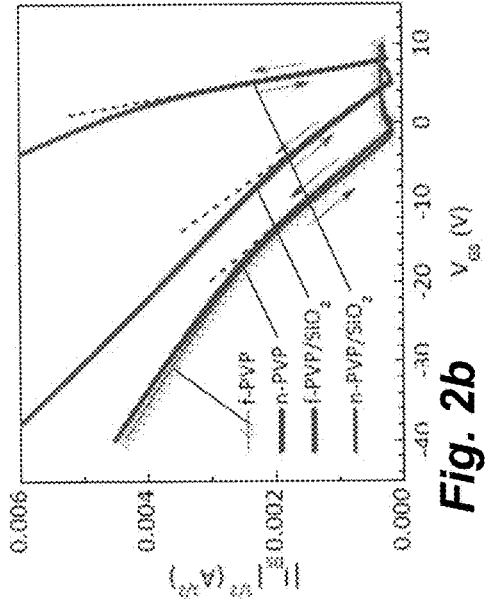
Fig. 2a
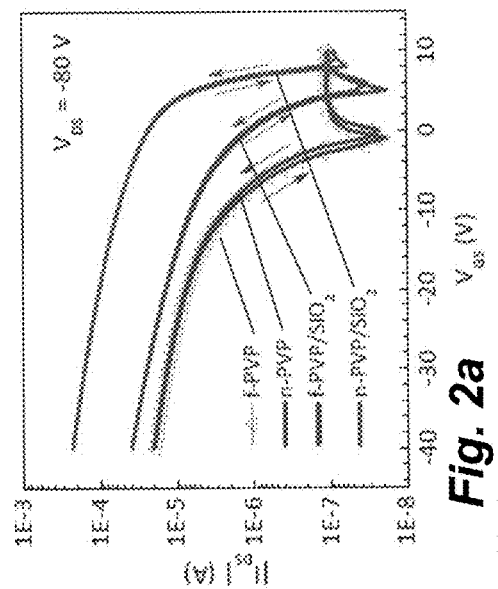
Fig. 2c
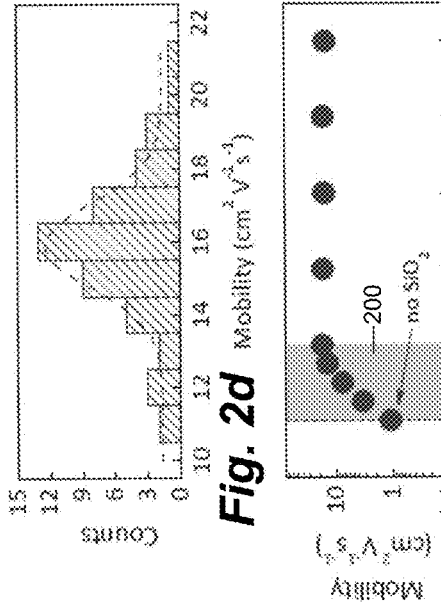
Fig. 2b
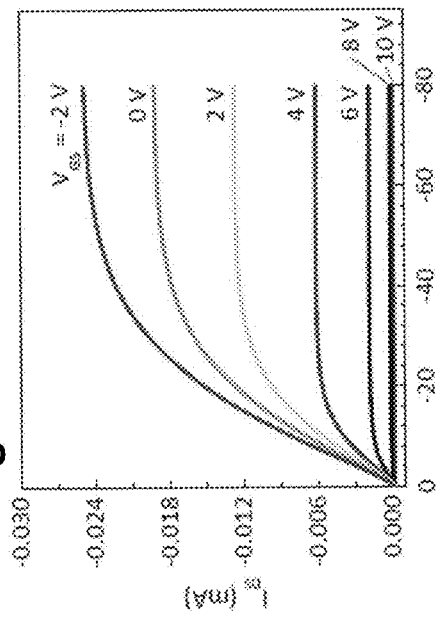
Fig. 2d
Fig. 2e

Meta-stable nanogrooves

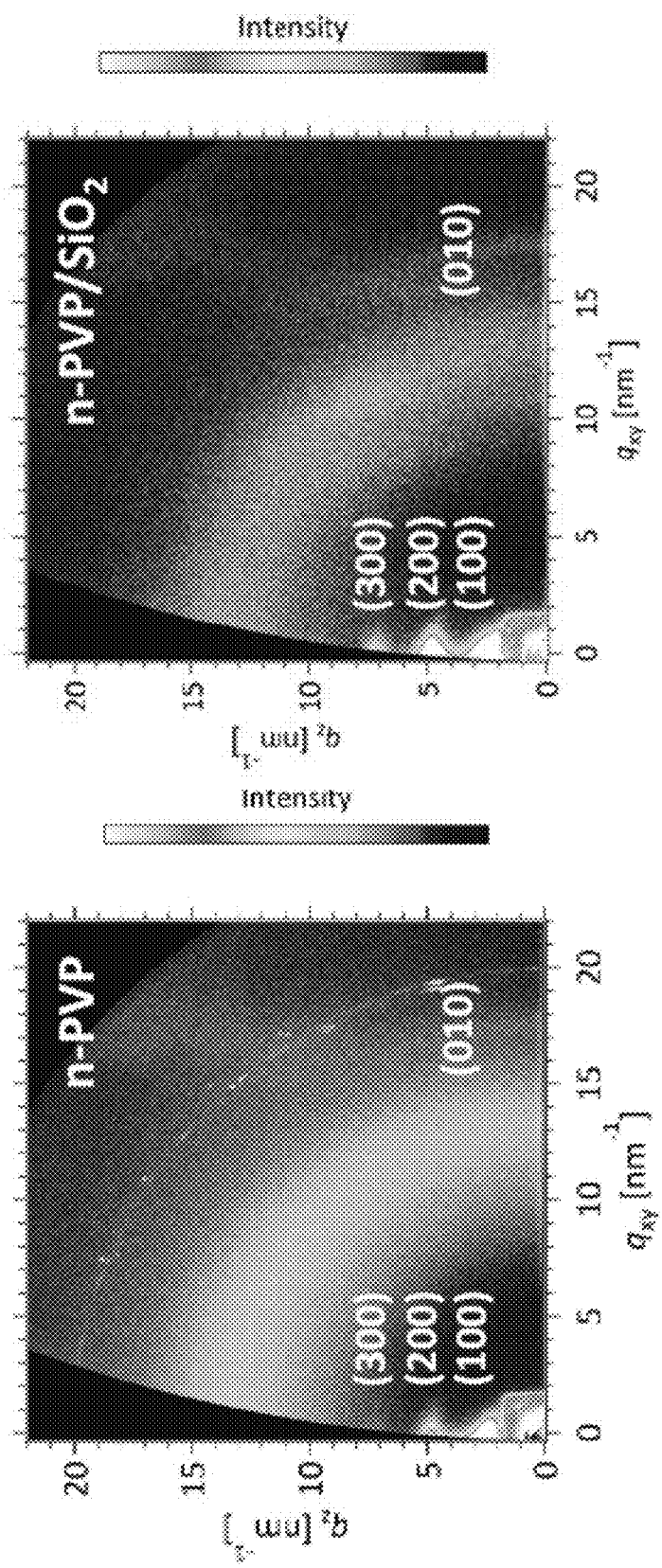
*Fig. 3e*  *Fig. 3f*

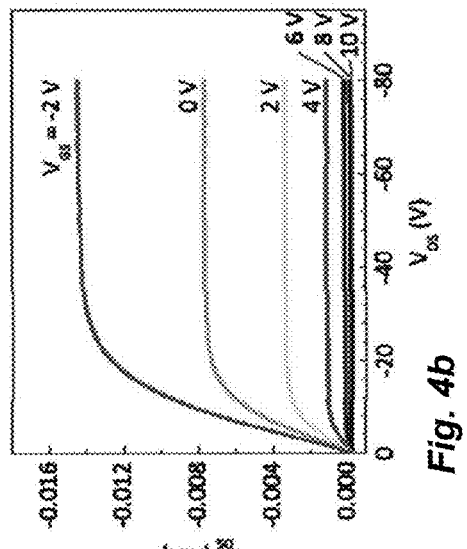
Fig. 4a
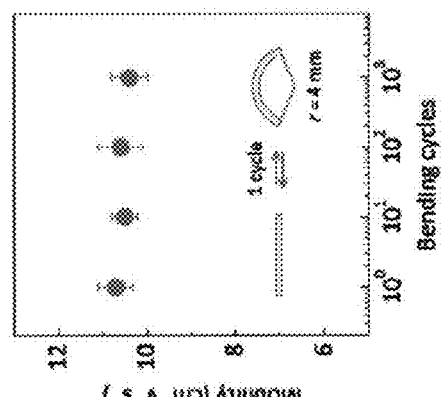
Fig. 4b
Fig. 4c Tensile bending
Fig. 4d Compressive bending
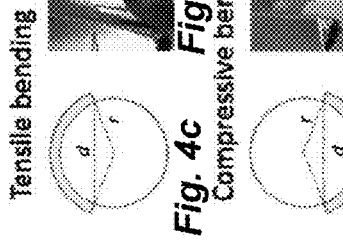
Fig. 4e
Fig. 4f
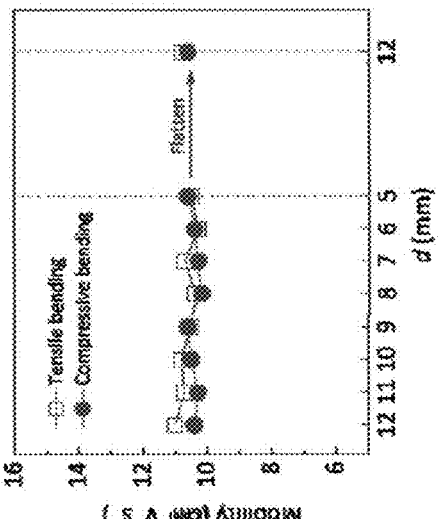
Fig. 4g
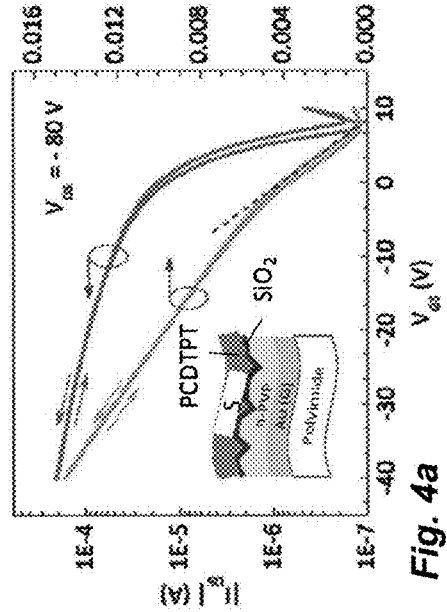
Fig. 4h

FLEXIBLE ORGANIC TRANSISTORS WITH CONTROLLED NANOMORPHOLOGY

CROSS REFERENCE TO RELATED APPLICATIONS

This application claims the benefit under 35 U.S.C. Section 119(e) of commonly-assigned U.S. Provisional Application Ser. No. 62/193,909 filed on Jul. 17, 2015 by Byoung Hoon Lee and Alan J. Heeger, entitled "FLEXIBLE ORGANIC TRANSISTORS WITH CONTROLLED NANOMORPHOLOGY", which application is incorporated by reference herein.

This application is related to the following commonly-assigned U.S. patent applications:

U.S. Provisional Patent Application No. 62/338,866, filed May 19, 2016, by Michael J. Ford, Hengbin Wang, and Guillermo Bazan, entitled "ORGANIC SEMICONDUCTOR SOLUTION BLENDS FOR SWITCHING AMBIPOLAR TRANSPORT TO N-TYPE TRANSPORT,";

U.S. Provisional Patent Application No. 62/327,311, filed Apr. 25, 2016, by Guillermo Bazan and Ming Wang, entitled "NOVEL WEAK DONOR-ACCEPTOR CONJUGATED COPOLYMERS FOR FIELD-EFFECT TRANSISTOR APPLICATIONS,";

U.S. Provisional Patent Application No. 62/276,145, filed Jan. 7, 2016, by Michael J. Ford and Guillermo Bazan, entitled "STABLE ORGANIC FIELD-EFFECT TRANSISTORS BY INCORPORATING AN ELECTRON-ACCEPTING MOLECULE,";

U.S. Provisional Patent Application No. 62/253,975, filed Nov. 11, 2015, by Ming Wang and Guillermo Bazan, entitled "FLUORINE SUBSTITUTION INFLUENCE ON BENZO[2,1,3]THIODIAZOLE BASED POLYMERS FOR FIELD-EFFECT TRANSISTOR APPLICATIONS,";

U.S. Provisional Patent Application No. 62/263,058, filed Dec. 4, 2015, by Byoung Hoon Lee, Ben B. Y. Hsu, Chan Luo, Ming Wang, Guillermo Bazan, and Alan J. Heeger, entitled "SEMICONDUCTING POLYMERS WITH MOBILITY APPROACHING ONE HUNDRED SQUARE CENTIMETERS PER VOLT PER SECOND,";

U.S. Provisional Patent Application No. 62/214,076, filed Sep. 3, 2015, by Byoung Hoon Lee and Alan J. Heeger, entitled "DOPING-INDUCED CARRIER DENSITY MODULATION IN POLYMER FIELD EFFECT TRANSISTORS,";

U.S. Provisional Patent Application No. 62/207,707, filed Aug. 20, 2015, by Michael Ford and Guillermo Bazan, entitled "HIGH MOBILITY POLYMER ORGANIC FIELD-EFFECT TRANSISTORS BY BLADE-COATING SEMICONDUCTOR: INSULATOR BLEND SOLUTIONS,";

U.S. Provisional Patent Application No. 62/262,025, filed Dec. 2, 2015, by Michael Ford and Guillermo Bazan, entitled "HIGH MOBILITY POLYMER ORGANIC FIELD-EFFECT TRANSISTORS BY BLADE-COATING SEMICONDUCTOR: INSULATOR BLEND SOLUTIONS,";

U.S. Utility patent application Ser. No. 15/058,994, filed Mar. 2, 2016, by Shrayesh N. Patel, Edward J. Kramer, Michael L. Chabinyc, Chan Luo and Alan J. Heeger, entitled "BLADE COATING ON NANOGROOVED SUBSTRATES YIELDING ALIGNED THIN FILMS OF HIGH MOBILITY SEMICONDUCTING POLYMERS,", which Application claims the benefit under 35 U.S.C. Section 119(e) of U.S. Provisional Patent Application No. 62/127,116, filed Mar. 2, 2015, by Shrayesh N. Patel, Edward J. Kramer, Michael L. Chabinyc, Chan Luo and Alan J. Heeger, entitled "BLADE COATING ON NANOGROOVED SUBSTRATES YIELDING ALIGNED THIN FILMS OF HIGH MOBILITY SEMICONDUCTING POLYMERS,";

U.S. Utility patent application Ser. No. 14/585,653, filed on Dec. 30, 2014, by Chan Luo and Alan Heeger, entitled "HIGH MOBILITY POLYMER THIN FILM TRANSISTORS WITH CAPILLARITY MEDIATED SELF-ASSEMBLY", which application claims the benefit under 35 U.S.C. Section 119(e) of U.S. Provisional Patent Application Ser. No. 61/923,452, filed on Jan. 3, 2014, entitled "HIGH MOBILITY POLYMER THIN FILM TRANSISTORS WITH CAPILLARITY MEDIATED SELF-ASSEMBLY,";

U.S. Utility patent application Ser. No. 14/426,467, filed on Mar. 6, 2015, by Hsing-Rong Tseng, Lei Ying, Ben B. Y. Hsu, Christopher J. Takacs, and Guillermo C. Bazan, entitled "FIELD-EFFECT TRANSISTORS BASED ON MACROSCOPICALLY ORIENTED POLYMERS," which application claims the benefit under 35 U.S.C. § 365 of PCT International patent application serial no. PCT/US13/058546 filed Sep. 6, 2013, which application claims the benefit under 35 U.S.C. Section 119(e) of U.S. Provisional Patent Application Ser. No. 61/698,065, filed on Sep. 7, 2012, and 61/863,255, filed on Aug. 7, 2013, entitled "FIELD-EFFECT TRANSISTORS BASED ON MACROSCOPICALLY ORIENTED POLYMERS,";

all of which applications are incorporated by reference herein.

STATEMENT REGARDING FEDERALLY SPONSORED RESEARCH AND DEVELOPMENT

This invention was made with Government support under Grant Nos. DMR 0856060 and DMR 1436263 awarded by the National Science Foundation to Alan J. Heeger. The Government has certain rights in this invention.

BACKGROUND OF THE INVENTION

1. Field of the Invention

This invention relates to a method and device for controlling morphology of semiconducting polymers, methods for fabricating flexible devices, and flexible devices such as flexible Organic Field Effect Transistors (OFETs).

2. Description of the Related Art (Note: This application references a number of different publications as indicated throughout the specification by one or more reference numbers in superscripts. A list of these different publications ordered according to these reference numbers can be found below in the section entitled "References." Each of these publications is incorporated by reference herein.)

Flexible organic field-effect transistors (OFETs) based on solution-processed semiconducting polymers and polymer dielectrics are of considerable interest for state-of-the-art flexible "Plastic Electronics"[1-6]. However, charge carrier mobilities have remained below industrial requirements due to the difficulty of aligning semiconducting polymers on meta-stable (swellable) polymer dielectrics.[1,7-9] As a result of the quasi-one-dimensional transport pathways of charge carriers along the backbone, charge transport in polymer semiconductors is limited by their nanomorphology[10]. Structural disorder, arising from the high degree of conformational freedom of polymer chains (causing chain folding, torsion, and structural defects) leads to electronic localization[11]. Thus, highly aligned polymer packing with minimized structural disorder is needed for achieving high mobility in conjugated polymers. Our recent progress toward this goal was reported using nanogrooved substrates to obtain chain alignment and associated anisotropy with resulting mobilities of 50 cm$^2$ V$^{-1}$ s$^{-1}$ (and even higher) for regioregular polymers[12-14], including poly[4-(4,4-dihexadecyl-4H-cyclopenta[1,2-b:5,4-b']dithiophen-2-yl)-alt-[1,2,5]thiadiazolo-[3,4-c]pyridine] (PCDTPT; see FIG. 1a for the molecular structure). By employing a "sandwich" casting system comprising oleophilic nanogrooved dielectrics and glass spacers, semiconducting polymers were oriented parallel to the nanogrooves by capillary action[14]. The aligned polymer thin films exhibited strong anisotropy, showing more than 10-fold higher mobility for transport along the direction of alignment than perpendicular to the alignment. This concept of directed self-assembly of semiconducting polymers using nanogrooved substrates is also promising for achieving high mobility in solution-processed flexible OFETs.

Despite such high mobility, however, one finds that it is challenging to develop high mobility flexible OFETs using the capillarity of polymer solutions onto nanogrooved substrates because the nanogrooved SiO$_2$ dielectric, which is a key component for inducing chain alignment, is a brittle material[15]. Therefore, a strategy for achieving high polymer alignment and high mobilities using a nanogrooved polymer dielectric, which is chemically and mechanically stable, is needed for the development of high mobility flexible OFETs. One or more embodiments of the present invention satisfy this need.

SUMMARY OF THE INVENTION

One or more embodiments of the present invention disclose an OFET, comprising a flexible structure, the flexible structure including a substrate; a channel on or above the substrate, the channel comprising one or more semiconducting polymers and the semiconducting polymers each comprising a main chain axis aligned with the channel; a source contact and a drain contact making contact to the semiconducting polymers, the source contact and the drain contact separated by a length of the channel; a gate contact; and a dielectric between the gate contact and the semiconducting polymers.

The OFET can be embodied in many ways, including, but not limited to, the following.

1. The substrate can be a plastic substrate, a polymer substrate, a glass substrate, or substrate comprising a material that is flexible for a bending radius as small as 4 millimeters (mm) or as small as 5 mm. For example, the substrate can be at least one film or foil selected from a polyimide film, a polyether ether ketone (PEEK) film, a polyethylene terephthalate (PET) film, a polyethylene naphthalate (PEN) film, a polytetrafluoroethylene (PTFE) film, a polyester film, a metal foil, a flexible glass film, and a hybrid glass film.

2. The semiconductor films can exhibit varying degrees of order. The semiconductor polymers in any of the previous embodiments can be oriented along one or more nanogrooves (e.g., having a depth of 6 nanometers (nm) or less and a width of 100 nm or less) in the substrate or dielectric.

3. The dielectric in any of the previous embodiments 1-2 can comprise the one or more nanogrooves orienting the main chain axes along an axis direction of the nanogrooves parallel to the length/alignment direction of the channel. Thus, one or more embodiments of the present invention further disclose a facile strategy for controlling the nanomorphology of semiconducting polymers on surface-modified (nano-grooved) polymer dielectrics.

4. In any of the preceding embodiments 1-3, the nanogrooves can be nanoimprinted into the dielectric or the substrate.

5. In any of the preceding embodiments 1-4, the semiconducting polymers can be cast from a solution onto the dielectric.

6. The dielectric in any of the previous embodiments 1-5 can increase or enhance mobility (e.g., saturation hole mobility) and/or alignment of the semiconducting polymers, as compared to the without the nanogrooves and/or the dielectric (e.g., the saturation mobility can be increased to at least 11.0 cm$^2$ V$^{-1}$ s$^{-1}$ or increased by a factor of at least 10). In one or more examples using nanogrooved polymer substrates covered with silicon dioxide (SiO$_2$) with finely adjusted thicknesses, oriented and aligned semiconducting polymer thin films were obtained, and the OFETs fabricated from the oriented semiconducting polymer, PCDTPT, yielded hole mobilities as high as 20.2 cm$^2$ V$^{-1}$ s$^{-1}$ as a result of the combination of structural order and diminished trap densities at the polymer/dielectric interface. Moreover, the flexible "plastic" FETs demonstrated excellent mechanical stability under severe bending conditions. These results represent important progress for solution-processed flexible OFETs, and demonstrate that high-mobility semiconducting polymers can be aligned by chemically stable soft nanostructures through directed self-assembly.

The dielectric in any of the previous embodiments 1-6 can have many different dielectric structures. The dielectric can be a single polymer dielectric layer, a bilayer comprising SiO$_2$ on a polymer dielectric (for example, the silicon dioxide can be on a surface of PVP, thereby forming the dielectric comprising a dielectric bilayer of SiO$_2$ on PVP), a bilayer comprising an alkylsilane or arylsilane SAM layer on SiO$_2$, or a multilayer comprising SiO$_2$ on a polymer and an alkylsilane or arylsilane SAM layer on the SiO$_2$.

8. The dielectric in any of the previous embodiments 1-7 can reduce swelling of the nanogrooves resulting from solution casting.

9. In any of the previous embodiments 1-8, the dielectric can be a gate dielectric.

10. In any of the preceding embodiments 1-9, the semiconducting polymers can have the compositions and structures disclosed herein (including, but not limited to, any of the examples described in Block 504 of FIG. 5).

11. In any of the preceding embodiments 1-10, the alignment, the composition and/or structure of the dielectric, the composition and/or structure of the semiconducting polymers, the composition and/or structure of the substrate, the composition and/or structure of the electrodes, can be effective to achieve:

π-π stacking of the semiconductor polymers characterized by a peak having a full width at half maximum of 2 nm$^{-1}$ or less, as measured by grazing incidence wide-angle X-ray scattering (GIWAXS); and/or the OFET having a field effect saturation hole mobility that changes by 10% or less under tensile and/or compressive bending (e.g., after 1000 cycles of tensile and/or compressive bending) of the substrate with a bending radius down to 4 mm; and/or the OFET having at least four times smaller turn on voltage ($V_{ON}$) shift as compared to the device without the dielectric layers, when a source-drain bias ($V_{DS}$) is varied from −80 V to −1 V; and/or the semiconducting polymers disposed in one or more fibers (the main axis along a long-axis of the fiber and the π-π stacking of the polymer chains in a direction along the short-axis of the fiber), the fibers continuously aligned with the alignment direction (or the axis direction of the nanogrooves) for a distance including, e.g., 2 micrometers. In one or more examples, the fibers are in bundles having a diameter of at least 50 nm and/or the fibers at least partially lie in nanogrooves; and/or a tilt, S, of the main-chain axis relative to a normal of the substrate less than or equal to −0.35 and/or an orientation, η, of the polymer main-chain axis relative to the alignment direction greater than or equal to 0.96.

Also disclosed is a method of fabricating an OFET, comprising fabricating a flexible structure, including providing a flexible substrate; depositing a dielectric on or above the substrate; casting one or more semiconducting polymers from a solution onto the dielectric on or above the flexible substrate; forming a source contact and a drain contact; and depositing a gate contact; wherein the OFET comprises: the dielectric between the gate contact and the semiconducting polymers, the source contact and the drain contact separated by a length of a channel comprising the one or more semiconducting polymers, the source and drain contact each making ohmic contact to the semiconducting polymers, and the semiconducting polymers each having a main chain axis aligned with an alignment direction in the channel.

BRIEF DESCRIPTION OF THE DRAWINGS

Referring now to the drawings in which like reference numbers represent corresponding parts throughout:

FIG. 1a and FIG. 1b illustrate schematic device architecture. FIG. 1c illustrates molecular structures of the PCDTPT, PVP, and HDA. FIGS. 1d-1g illustrate Atomic Force Microscope (AFM) images and corresponding line profiles of the n-SiO$_2$ (FIG. 1d), OrmoStamp® (FIG. 1e), n-PVP (FIG. 1f), and n-PVP/SiO$_2$ (FIG. 1g) substrates. The SiO$_2$ thickness is approximately 2 nm. The inset image in FIG. 1f represents the AFM image of the f-PVP substrate (7 μm×7 μm), showing smooth surface (RMS<0.5 nm).

FIGS. 2a-2e illustrate transistor characteristics of PCDTPT thin films fabricated on various dielectrics. FIG. 2a and FIG. 2b show transfer curves of the device with the f-PVP, n-PVP, f-PVP/SiO$_2$, and n-PVP/SiO$_2$ (2 nm thick) dielectrics taken at drain source voltage ($V_{DS}$)=−80 V (having width W=1000 micrometers (μm) and Length L of 200 μm). FIG. 2c shows output curves of the device with the n-PVP/SiO$_2$ dielectric taken at various gate-source voltage ($V_{GS}$) from 10 V to −2 V. FIG. 2d shows the mobility distribution for 30 devices with the n-PVP/SiO$_2$ dielectrics. Average mobility is 15.7±2.2 cm$^2$ V$^{-1}$ s$^{-1}$. FIG. 2e shows mobility variations of the devices with the n-PVP/SiO$_2$ dielectrics with varying thicknesses of SiO$_2$ layers. $I_{ds}$ is drain source current in Amps (A).

FIGS. 3a-3i illustrate Atomic Force Microscope (AFM) and grazing incidence wide-angle X-ray scattering (GI-WAXS) data, and electric-field and temperature dependent mobilities of devices fabricated according to one or more embodiments of the present invention. FIG. 3a and FIG. 3b show AFM topographic images of the bottom surfaces of the PCDTPT thin films deposited on the n-PVP (FIG. 3a) and n-PVP/SiO$_2$ (2 nm thick) (FIG. 3b) substrates, wherein the scale is 10 μm×10 μm. FIGS. 3c-d show schematic illustrations of two deposited thin films prepared on the n-PVP (FIG. 3c) and n-PVP/SiO$_2$ (2 nm)(FIG. 3d) substrates. FIGS. 3e-3f show 2D GIWAXS patterns of the PCDTPT thin films fabricated onto the Si/n-PVP (FIG. 3e) and Si/n-PVP/SiO$_2$ (2 nm) (FIG. 3f) substrates. FIG. 3g shows GIWAXS line profiles of the PCDTPT thin films using constant, grazing incident angle with in-plane scattering geometry. The intensity is normalized to incident photon energy. q denotes the scattering vector. FIG. 3h shows turn on voltage ($V_{ON}$) variations as a function of various source-drain bias ($V_{DS}$) taken from the transfer curves shown in Supplementary Fig. S5 in the Supplementary Information[31]. The lines indicate polynomial fit curves. FIG. 3i shows temperature dependent mobilities of the devices with the n-PVP and n-PVP/SiO$_2$ (2 nm) dielectrics. The numbers indicate the activation energy ($E_A$) values for each device. The lines indicate exponential fit curves.

FIGS. 4a-4h illustrate characterization of flexible transistors fabricated by doctor blade casting according to one or more embodiments of the invention. FIG. 4a shows transfer curves and FIG. 4b shows output curves of the flexible device with the n-PVP/SiO$_2$ (2 nm) dielectric fabricated on transparent polyimide substrate (W/L=1,000/200 μm). The inset in FIG. 4a represents the cross-section of the flexible device architecture. FIGS. 4c-4d show schematic illustrations of tensile (FIG. 4c) and compressive bending (FIG. 4d) and FIGS. 4e-4f show corresponding photographs of flexible devices in the measurement system during tensile bending (FIG. 4e) and compressive bending (FIG. 4f). FIG. 4g shows mobility variations as a function of bending distance (d) under tensile and compressive bending stress. FIG. 4h shows mobility variations with increasing number of bending cycles (bending radius, r: 4 mm). Error bars denote standard deviation.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

Examples

Figures 1A, 1B, 1C:
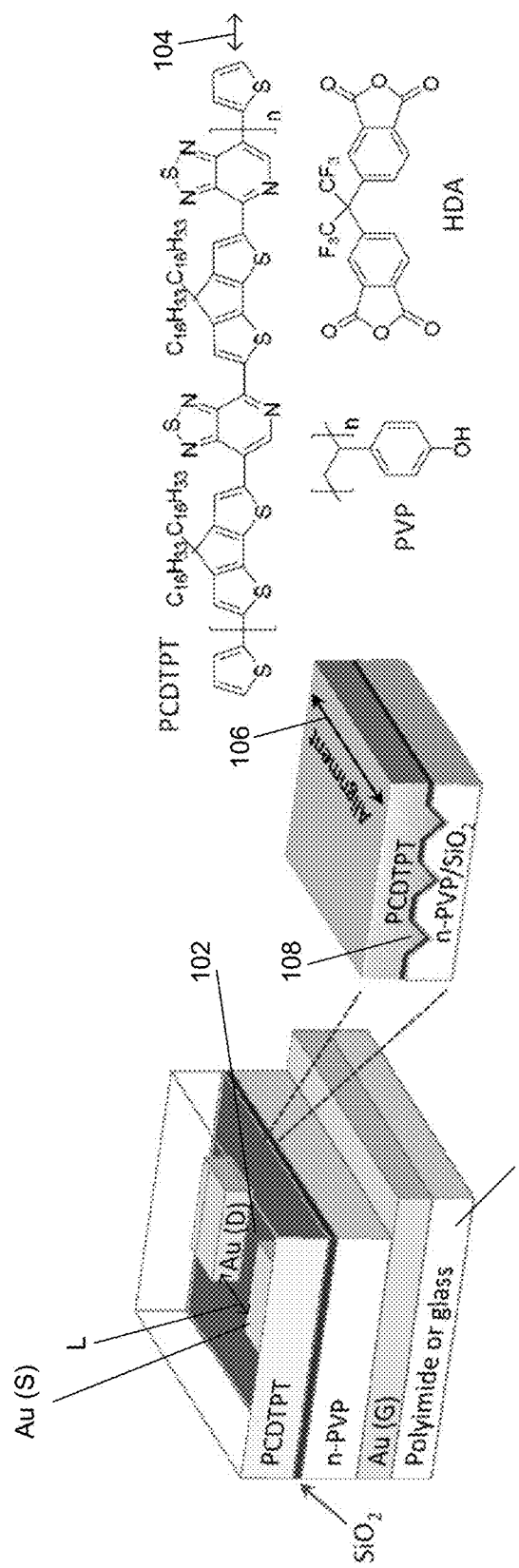
FIGS. 1a-1g illustrate device structure, materials, and Atomic Force Microscope (AFM) images of textured substrates.

FIG. 1a, FIG. 1b, and FIG. 1c illustrate an OFET that can comprise a flexible structure, including a substrate 100 (e.g., polyimide or glass), a channel 102 (comprising semiconducting polymers PCDTPT) on or above the substrate 100, a source contact (S) and a drain contact (D) to the semiconducting polymers, a gate contact (G); and a dielectric (e.g., SiO$_2$ on n-PVP) between the gate contact G and the semiconducting polymers. FIG. 1a further illustrates the source contact S and the drain contact D are separated by a length L of the channel. FIGS. 1a-1c further illustrate the semiconducting polymers each comprise a main chain axis 104 aligned with or parallel to an alignment direction 106 (e.g., along/parallel to the length L) in the channel 102. In the embodiments illustrated in FIGS. 1a-1c, the contacts S, D, and G are gold (Au) contacts (but other materials can also be used) and the dielectric (SiO$_2$ and n-PVP) comprises nanogrooves 108 orienting the main chain axes 104 along an axis direction 106 of the nanogrooves parallel to the length L.

Embodiments of the present invention illustrated in FIGS. 1a-1c achieve OFETs with the highest mobilities of 20.2 cm$^2$ V$^{-1}$ s$^{-1}$ and 11.0 cm$^2$ V$^{-1}$ s$^{-1}$ fabricated on rigid and plastic substrates, respectively, showing excellent mechanical flexibility. These high mobilities were achieved by aligning PCDTPT onto SiO$_2$-covered nanogrooved polymer dielectrics through directed self-assembly along the nanogrooves. (FIG. 1a). Thus, one or more embodiments of the present invention align the semiconducting polymers through a directed self assembly that is critical to the solution-casting process.

Nanogrooved polymer dielectrics were prepared by thermally-assisted nanoimprint lithography (T-NIL)[1,16,17]. Poly (4-vinylphenol) crosslinked with 4,4'-(hexafluoroisopropylidene)diphthalic anhydride (PVP:HDA, see FIG. 1a for their molecular structures) was used as dielectric material due to higher solvent resistance and low surface roughness[18,19]. A nanogrooved SiO$_2$ (henceforth referred to as n-SiO$_2$) substrate was used as a master mold to fabricate the photo-crosslinkable OrmoStamp® stamping/imprinting material. All fabrication details can be found in the Example Methods section and Supplementary Information[31].

Figure 1D:
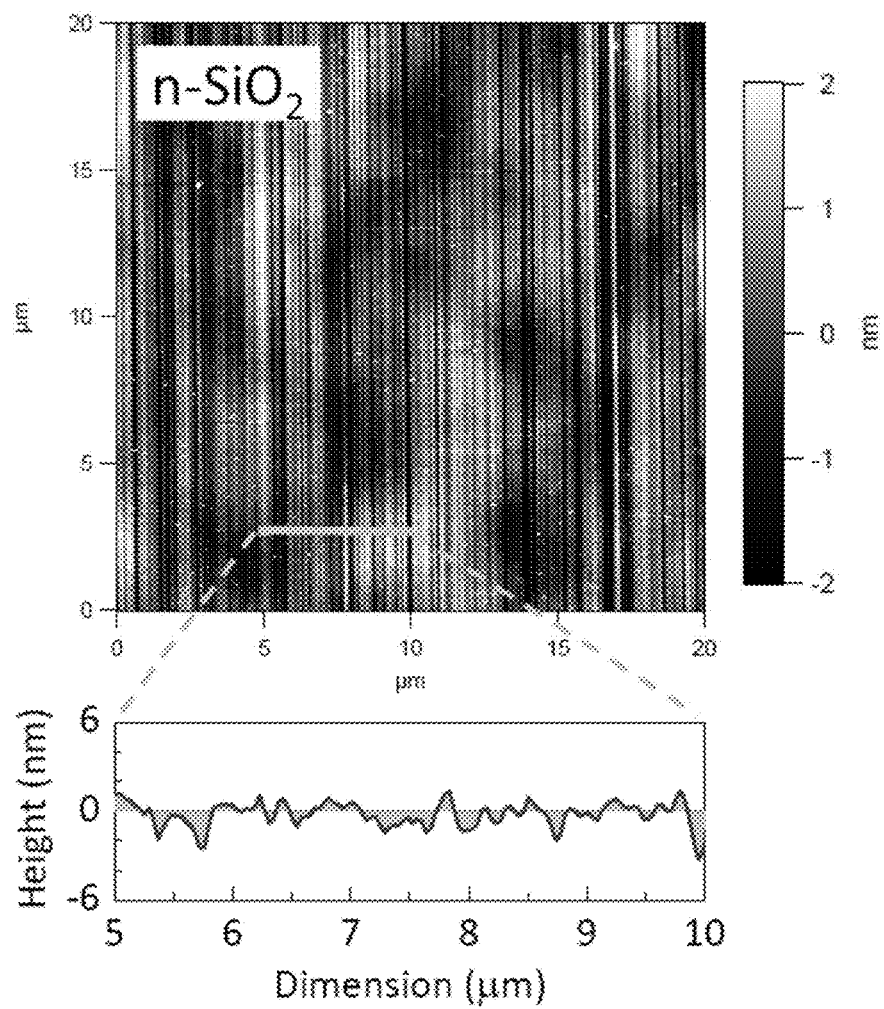
Figure 1E:
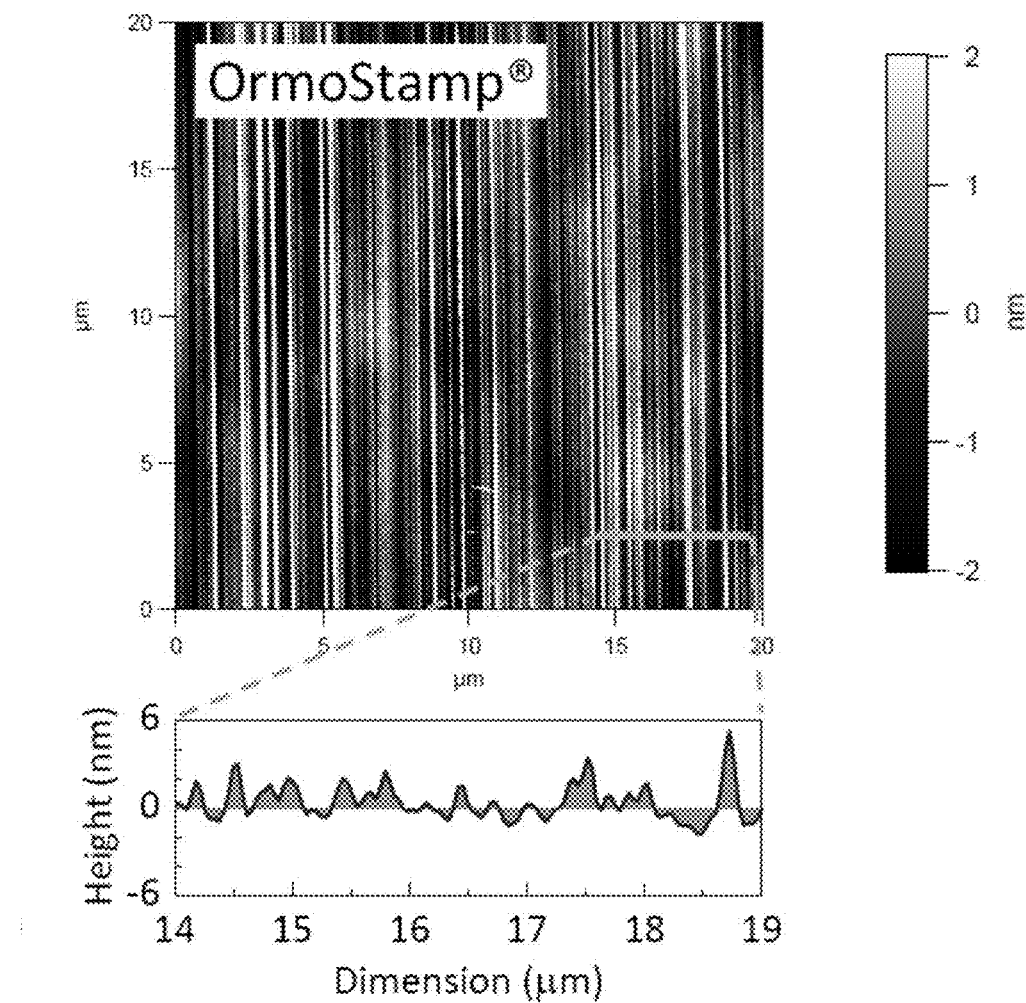
Figure 1F:
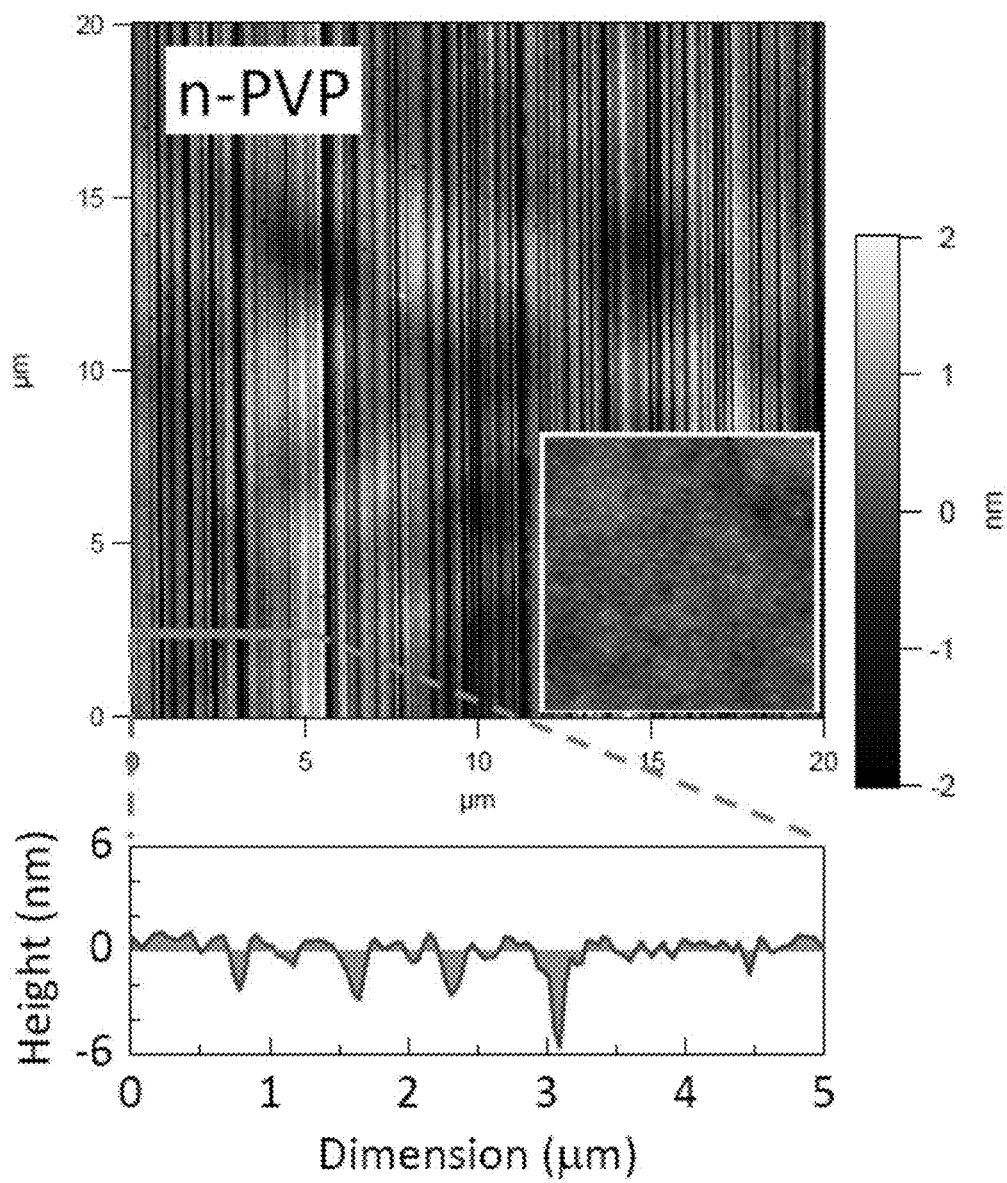
Figure 1G:
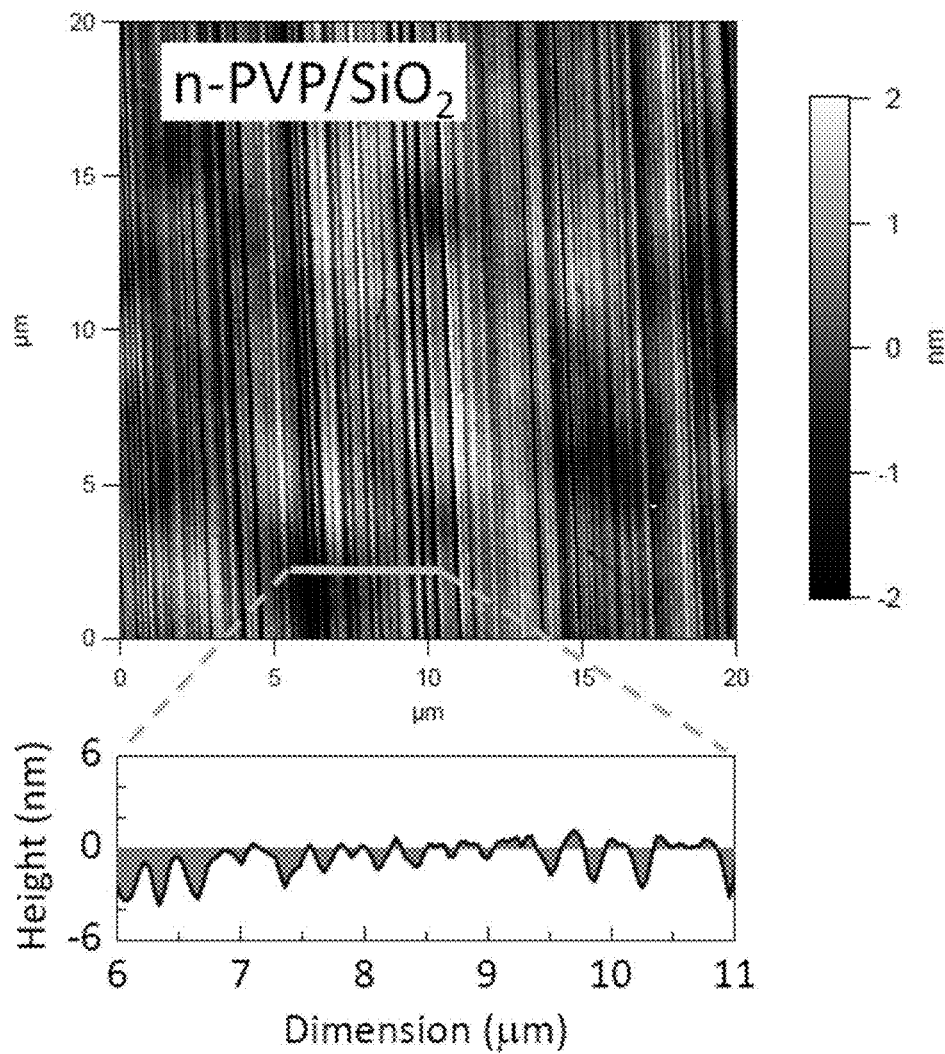

AFM images of textured substrates produced in the T-NIL process are displayed in FIGS. 1b-1e. The inventors emphasize that nanogrooves on the nanogrooved PVP:HDA (n-PVP) are very clear and uniform over the whole substrate (12.2 mm×7.7 mm) even with an additional 2-nm-thick SiO$_2$ layer (FIGS. 1f and 1g), and appear to be identical to those on the n-SiO$_2$ master (FIG. 1d). Embodiments of the present invention also performed T-NIL using polydimethylsiloxane (PDMS)[1,16,17] and hard-PDMS[1,17,21] as working stamps instead of the OrmoStamp®, but no clear nanostructures were seen on the PVP:HDA thin films in these examples (see Supplementary Fig. S2 in the Supplementary Information[31]). Due to the well-established nanogrooves on the n-PVP substrate (FIG. 1f), enhanced mobility is anticipated for the devices with the n-PVP dielectrics.

Accordingly, OFETs were fabricated by casting the PCDTPT onto glass/Au/n-PVP substrates with pre-patterned Ni/Au source and drain electrodes in the sandwich casting system[14] to complete the bottom gate bottom contact (BGBC) geometry (see FIG. 1a). FIGS. 2a-2e represent transistor characteristics of OFETs with various combinations of dielectrics (flat PVP:HDA (f-PVP), nanogrooved PVP:HDA (n-PVP), f-PVP/SiO$_2$, and n-PVP/SiO$_2$). Transfer curves of the OFETs are displayed in FIGS. 2a and 2b.

The field-effect mobilities can be extracted in the saturation regime from the following equation, $I_{DS}=(W/2L)C\mu(V_{GS}-V_T)^2$, where, W is the channel width (1,000 μm), L is the channel length (200 μm), C is the gate dielectric capacitance per unit area, μ is the carrier mobility, $I_{DS}$ is the drain-source current, $V_{GS}$ is the gate-source voltage, and $V_T$ is the threshold voltage. The output curves at high $V_{GS}$ do not show saturation (Supplementary Fig. S3 in the Supplementary information[31]), but show clear saturation at low $V_{GS}$ as shown in FIG. 2c. Thus, accurate mobilities using the formula described above can be obtained only in the low $V_{GS}$ regime ($V_{GS}-V_T \leq 5$ V). Additionally, low hysteresis is observed for all devices with forward and reverse sweeping of $V_{GS}$, indicating that a low density of shallow traps is present at the polymer/dielectric interface. Contrary to expectations that the PCDTPT films on the n-PVP dielectric will lead to enhanced mobility, the device with the n-PVP dielectric produced a nearly identical transfer curve and low mobility (μ=1 cm$^2$ V$^{-1}$ s$^{-1}$) compared with those of the device with the f-PVP dielectric (FIGS. 2a and 2b). This is likely to be associated with the failure of the formation of crystalline PCDTPT seeds in the nanogrooves on the n-PVP dielectric, presumably due to the swelling of the n-PVP surface in the solution-casting process. Although nanogrooves on the n-PVP substrates are stable with organic solvent treatment (see Supplementary Fig. S4 in the Supplementary Information[31]), it is reasonable to assume that only 3-nm-height nanogrooves on the n-PVP dielectric are difficult to maintain in contact with solvent (here, chlorobenzene) during the film-forming process[7], thereby leading to limited space for chain alignment (seed formation), considering that the lamellar packing distance for PCDTPT (edge-on orientation) is approximately 2.51 nm[22].

Based on this hypothesis, an ultrathin SiO$_2$ layer was introduced by atomic layer deposition (ALD) on top of the n-PVP dielectric to prevent the swelling of nanogrooves. With a 2-nm-thick SiO$_2$ layer on top of the n-PVP dielectric, the mobility increased by a factor of 20 with the highest mobility of 20.2 cm$^2$ V$^{-1}$ s$^{-1}$, demonstrating low contact resistance as seen by the output curves (FIG. 2c). The inventors note this mobility is obviously higher than that (μ=1.5 cm$^2$ V$^{-1}$ s$^{-1}$) of the device with the f-PVP/SiO$_2$ dielectric, and thus is attributed to higher chain alignment by the guidance of nanogrooves on the n-PVP/SiO$_2$ substrate. The inventors also emphasize that such device performance is highly reproducible throughout the whole device area, showing a narrow distribution of mobility for 30 devices with the n-PVP/SiO$_2$ dielectrics with an average mobility of 15.7 cm$^2$ V$^{-1}$ s$^{-1}$ (FIG. 2d). This result indicates that shallow nanogrooves with a depth below 3 nm can be successfully fabricated throughout the whole device area by T-NIL, and can lead to efficient chain alignment of overlying semiconducting polymers. More interestingly, mobility is gradually increased as SiO$_2$ thickness increases up to approximately 2 nm, and saturates with thicker SiO$_2$ layers, as shown in FIG. 2e. The results in the low thickness regime (<2 nm; marked with a rectangle 200) are particularly interesting because the mobility is steadily enhanced with small increases in SiO$_2$ thickness (approximately 0.5 nm interval), showing an increase in mobility over one order of magnitude. Because contact resistance difference for both devices with the n-PVP and n-PVP/SiO$_2$ dielectrics is negligible owing to the same channel dimensions (W/L=1,000/200 μm) and source/drain electrodes (Au), such increased mobility could be explained by gradually enhanced polymer alignment with increasing SiO$_2$ thicknesses.

Figure 3A:
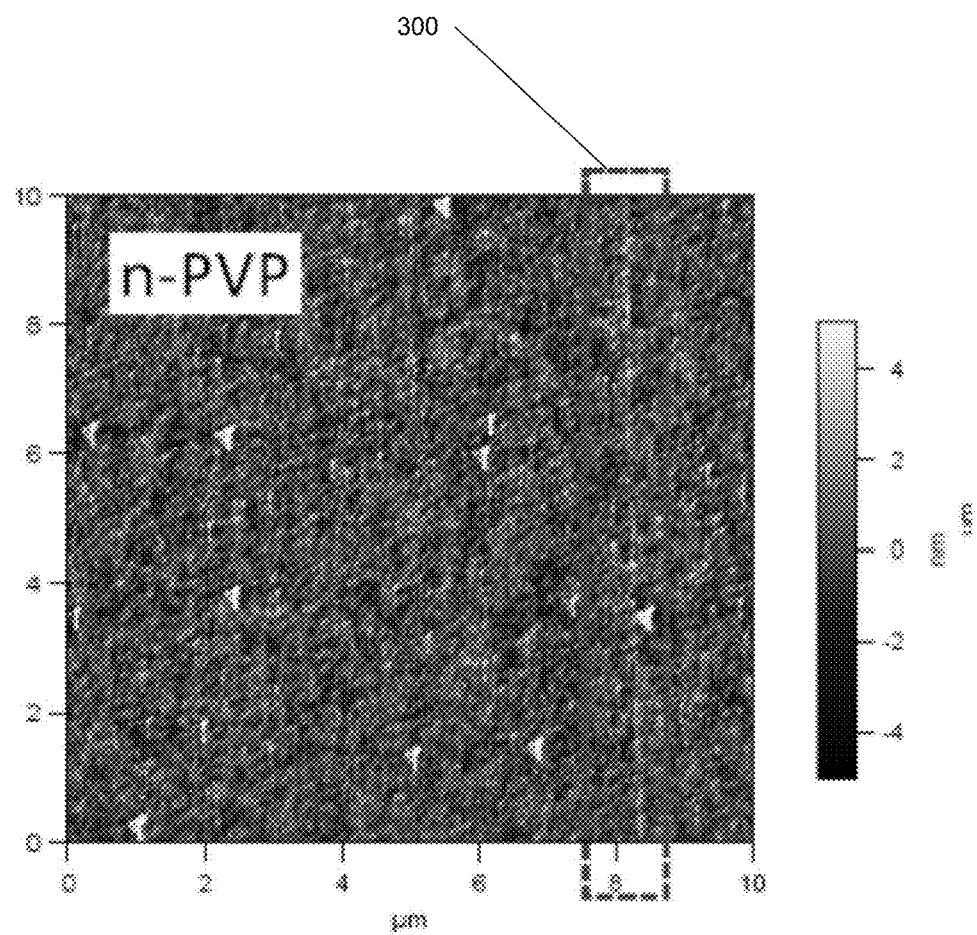
Figure 3B:
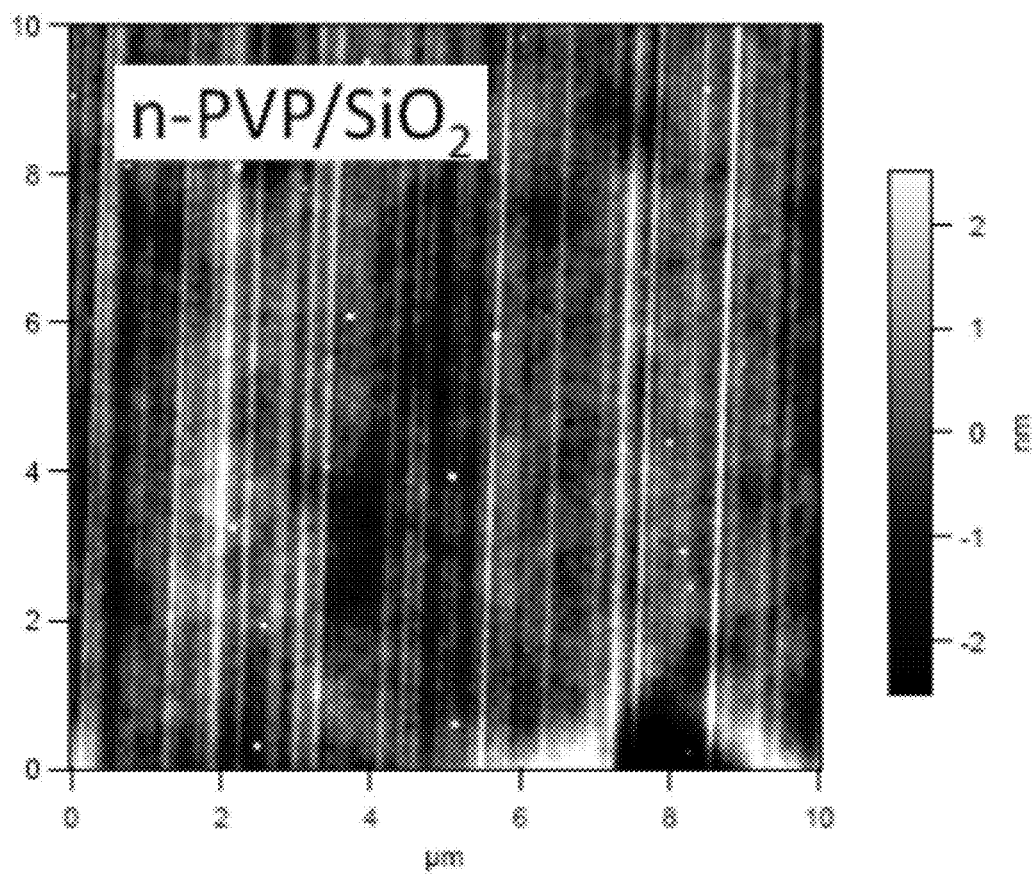
Figure 3C:
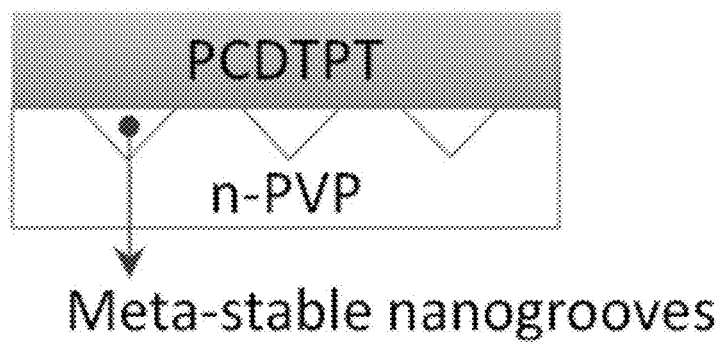
Figure 3D:
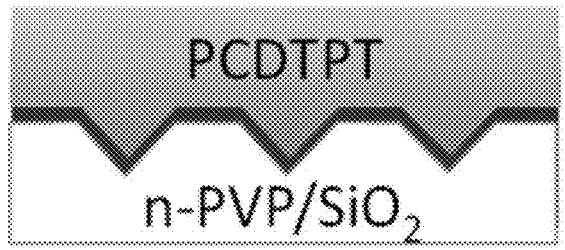

In order to confirm the hypothesis that introduction of SiO$_2$ can enhance polymer alignment at the polymer/dielectric interface, AFM was performed to examine and compare the nanomorphology on the bottom surfaces of polymer films prepared on the n-PVP and n-PVP/SiO$_2$ substrates. Details for sample preparation can be found in Supplementary Information[31]. FIGS. 3a and 3b show AFM topographic images of the bottom surfaces of PCDTPT thin films (taken from areas in the channels used for transistor characteristics shown in FIG. 2). The film prepared on the n-PVP substrate exhibits obviously featureless surfaces. Interestingly, polymers tend to be aligned along the nanogrooves in some areas (rectangle 300 in FIG. 3a)—presumably in deep nanogrooves formed by diamond aggregates during the master mold fabrication, but appear to be discontinuous (see also Supplementary Fig. S5, in the Supplementary Information[31], for the magnified AFM image). By contrast, the film prepared on the n-PVP/SiO$_2$ substrate shows uniaxial nanostructures, aligned parallel to the nanogrooves. These oriented nanostructures are present throughout the bottom surface with dimensions comparable to nanogrooves on the n-PVP/SiO$_2$ substrates (see FIG. 1e), demonstrating our hypothesis that SiO$_2$ on top of the n-PVP substrate allows polymers to have ample space in the nanogrooves allotted for chain alignment by preventing the swelling of the n-PVP surface, as illustrated in FIG. 3d (in contrast to FIG. 3c without the SiO$_2$).

The crystalline structure and orientation of PCDTPT thin films on various substrates were further characterized through grazing incidence wide-angle X-ray scattering (GI-WAXS) experiments. FIGS. 3e and 3f show two dimensional (2D) GIWAXS images for PCDTPT thin films prepared on n-PVP and n-PVP/SiO$_2$ (2 nm) substrates, respectively, in the sandwich casting system. The observed diffraction pattern is consistent with previous reports[14,22]. However, a strong amorphous halo is observed due to scattering from the PVP layer from approximately q=10 to 20 nm$^{-1}$, where q is the scattering vector. The strong "out-of-plane" lamellar alkyl stacking (h00) reflections and the "in-plane" π-π reflection at q~17.8 nm$^{-1}$ indicate that the crystallites have a preferential "edge-on" orientation. The characteristic π-π packing distance, $d_{\pi-\pi}$, is approximately 0.35 nm for both films. The π-π stacking peak is more clearly seen through the comparison of the normalized line-profiles along the $q_{xy}$ (in-plane) direction, shown in FIG. 3g. Although the π-π stacking peak is also observed for the PCDTPT thin film prepared on n-PVP substrate due to "discontinuous" alignment described above (see FIG. 3a), the enhanced carrier mobility could be explained by "continuous" uniaxial alignment of PCDTPT along nanogrooves on the n-PVP/SiO$_2$ substrates.

To assess how polymer alignment affects carrier transport in OFETs, one or more embodiments of the present invention performed electric-field dependent transconductance measurements for the devices with the n-PVP and n-PVP/SiO$_2$ dielectrics. Transfer curves were taken with varying source-drain bias ($V_{DS}$) from −80 V to −1 V, and are shown in Supplementary Fig. S6 in the Supplementary Information[31]. To compare trap-assisted turn-on voltage ($V_{ON}$) shifts for both devices, the $V_{ON}$ values extracted from the transfer curves are plotted as a function of decreasing $V_{DS}$ in FIG. 3h. Notably, four times larger $V_{ON}$ difference (12 V) is observed for the device with the n-PVP dielectric compared with that (3 V) of the device with the n-PVP/SiO$_2$ dielectric. Since a large $V_{ON}$ shift can be attributed to increased trap density[23], the reduced $V_{ON}$ shift for the films prepared on the n-PVP/SiO$_2$ substrate indicates mitigated trap density for aligned PCDTPT thin films prepared on the n-PVP/SiO$_2$ substrate.

To further investigate the effect of alignment on reducing trap density at the polymer/dielectric interface, temperature dependent mobility measurements were carried out for devices with the n-PVP and n-PVP/SiO$_2$ dielectrics. Mobility variations as a function of reciprocal temperature (1/T) are displayed in FIG. 3i, as extracted in the temperature range from 130 Kelvin (K) to 240 K. The mobility is thermally activated and follows a simple Arrhenius relationship[24]. The activation energy ($E_A$), the energy difference between the trap state and the conduction band edge, can be calculated from $\mu_{eff} \approx \mu_0 \exp(-E_A/kT)$[24], where $\mu_{eff}$ is the effective mobility, $\mu_0$ is the free carrier mobility, k is the Boltzmann constant, and T is the temperature. Relatively lower $E_A$ (47 meV) is observed for the device with the n-PVP/SiO$_2$ dielectric, compared with that (57 meV) of the device with the n-PVP dielectric. The inventors note that this low $E_A$ is consistent with the previous result[12], and is similar to the values for other high-mobility semiconducting polymers[24]. The low $E_A$ also indicates that a low trap density is present in the aligned PCDTPT thin film prepared on the n-PVP/SiO$_2$ substrate.

It is noteworthy that surface modification with SiO$_2$ can change surface energy of the n-PVP substrate, which is important for determining polymer alignment during the capillarity-mediated sandwich casting process[14]. In particular, passivation of the substrates with a self-assembled monolayer (here, n-decyltrichlorosilane; n-DTS) can further increase the difference in surface energies between n-PVP and n-PVP/SiO$_2$ substrates due to a different density of reaction sites (i.e., hydroxyl group) on the surfaces. However, contact angle measurement results showed similar surface energies for both the n-PVP (13 mN m$^{-1}$) and n-PVP/SiO$_2$ (10 mN m$^{-1}$) substrates after the n-DTS passivation (Supplementary Fig. S7 in the Supplementary Information[31]). Such a small difference is not sufficient to explain the increases in polymer alignment and mobility by more than one order of magnitude.

To confirm the feasibility of employing the n-PVP/SiO$_2$ thin films in real flexible electronics, flexible OFETs were fabricated onto transparent polyimide substrates using the same device configuration (BGBC) described above (see FIG. 4a). The inventors note that PCDTPT thin films on flexible substrates were deposited by doctor blade casting instead of the sandwich casting because (1) flexible substrates are not suitable for sandwich casting geometry[14] and (2) doctor blade casting is a more promising film casting technique for real roll-to-roll fabrication of flexible electronics[3]. As extracted from the transfer curve shown in FIG. 4a, the flexible OFET produced a hole mobility, μ=11.0 cm$^2$ V$^{-1}$ s$^{-1}$, and showed clear saturation of the output curves (FIG. 4b). The inventors note that this mobility is potentially comparable to the highest mobility (μ=20.2 cm$^2$ V$^{-1}$ s$^{-1}$) of the rigid device, considering that the doctor blade cast PCDTPT thin film on the n-SiO$_2$ substrate yielded relatively lower carrier mobility (μ≈27.0 cm$^2$ V$^{-1}$ s$^{-1}$) compared with that (μ≈56.0 cm$^2$ V$^{-1}$ s$^{-1}$) of the sandwich cast counterpart (Supplementary Fig. S8 in the Supplementary Information).

Bending stability is important to ensure useful applications of the flexible OFETs according to one or more embodiments of the present invention. Accordingly, embodiments of the present invention measured device performances under various bending conditions (tensile and compressive bending) and continuous bending stress. FIGS. 4c-4f shows schematic illustrations of tensile and compressive bending as well as corresponding photographs of flexible devices in the measurement system. Mobility variations as a function of bending distance are displayed in FIG. 4g. The inventors note that mobilities are almost constant under tensile and compressive bending with a bending distance as small as 5 mm. Notably, this flexible device showed no significant decrease in mobility under continuous bending up to 1,000 cycles of repetitive bending tests (FIG. 4h). Despite the high Young's modulus of SiO$_2$ employed[15], such high bending stability could be explained by low bending strain applied to the SiO$_2$ layer owing to the extremely low thickness (ca. 2 nm) of the SiO$_2$ layer, which can be estimated from the simple relationship: ε≈t/2r, where ε is the bending strain, t is the total film thickness, and r is the bending radii[25]. These results demonstrate that the n-PVP/SiO$_2$ thin film could be a useful component for flexible electronics.

From the perspective of fabrication manner, such polymer/polymer (dielectric) interfaces in OFETs can also be modified with solution-processed dielectric materials (such as polymethylsilsesquioxane (PMSQ)[9], amorphous alumina[26], and yttrium oxide[27]) as interfacial layers to prevent the interlayer mixing or swelling at the polymer/dielectric interface during the solution-casting process. However, there exists no possible casting method from solution to effectively cover the nanogrooved polymer dielectrics without destroying the shallow nanogrooves with a depth below only 3 nm (see FIG. 1d). Alternatively, nanoimprinting with more solvent-resistant (i.e., extremely crosslinked and pinhole free) polymer dielectrics could be the best alternative (to the bilayer dielectric according to one or more embodiments of the present invention) for achieving high mobility of flexible OFETs fabricated by all-solution-processing. In that context, one or more embodiments of the present invention introduced several polymer systems including thermally crosslinked poly(vinylalcohol) with ammonium dichromate (PVA:AD)[28] and poly(methyl methacrylate) (PMMA)[29], and photo-crosslinked poly(vinyl cinnamate) (PVCN)[30] instead of the PVP:HDA, but nanostructure and device fabrications were not successful due to the relatively lower thermal stability (i.e., low glass transition temperature, $T_g$) and solvent resistance of the polymer dielectrics used. However, one finds that polymers with moderately high $T_g$ (100-160° C.) are required for achieving high fidelity nanogrooves on nanoimprinted polymers and resulting high mobility even after thermal curing of dielectric polymers and semiconducting polymers for better device performance.

By demonstrating that nanomorphology of semiconducting polymers can be tailored, by facile interface engineering of nanoimprinted polymer dielectrics, for achieving high polymer alignment, and that the aligned polymer thin films lead to high mobility as well as excellent bending stability in flexible OFETs, the results achieved using one or more embodiments of the present invention suggest that polymer-based flexible OFETs are promising for realizing high-performance flexible electronics.

Example Methods

The following methods were used for fabricating the devices illustrated in FIG. 1a-1g and used to obtain the measurements illustrated in FIGS. 2-4.

Fabrication of Master Mold.

As a master mold, a nanogrooved $SiO_2$ (henceforth referred to as n-$SiO_2$) substrate was prepared by rubbing a Si/$SiO_2$ substrate (an n$^{++}$Si (500 μm thick)/$SiO_2$ (300 nm thick) substrate from International Wafer Services Co.) with a diamond lapping disc with particle sizes of 100 nm (Allied High Tech Products Inc.) as described in detail in a previous report[12].

Fabrication of OrmoStamp.

The photo-crosslinkable OrmoStamp® was chosen as the stamping material because of its high hardness[20], which is required for achieving high-fidelity nanostructures on polymer substrates. The OrmoStamp® (MicroChem Co.) liquid (30 μL) was mounted on the n-$SiO_2$ substrate passivated with a perfluorodecyltrichlorosilane (FDTS) self-assembled monolayer (as an anti-sticking layer) using molecular vapor deposition system (MVD 100E, Applied Microstructures, Inc.) after oxygen plasma treatment (PEII plasma etching system, Technics Inc.) for 10 minutes (min) at 100 Watts (W) Radio Frequency (RF) plasma power with continuous oxygen flow (300 mTorr), and was subsequently covered by the ultrasmooth glass substrate. Note that the glass substrate was ultraviolet/ozone treated for 15 min, and was covered by the OrmoPrime08® (MicroChem Co.) as an adhesive layer by spin casting at 4,000 rpm for 60 seconds (s) followed by baking at 150° C. for 5 min, prior to being mounted on the OrmoStamp® droplet. Then, the OrmoStamp® in between the n-$SiO_2$ and glass substrates was exposed to ultraviolet light (wavelength~365 nm) for 10 min for crosslinking. The nanostructured OrmoStamp® on glass substrate, as a positive replica of the n-$SiO_2$ master mold, was cured at 130° C. for 30 min for hardening of nanostructures, and was treated with the FDTS anti-sticking layer.

Preparation of Nanogrooved Polymer Dielectric.

A flat PVP:HDA (f-PVP) layer was spin cast from a propylene glycol monomethyl ether acetate (PGMEA, Sigma-Aldrich Co.) solution with a total concentration of 100 mg mL$^{-1}$ of PVP:HDA (10:1 by weight, Sigma-Aldrich Co.) to form a 400-nm-thick thin film on ultrasmooth glass substrates (Corning Eagle XG wafer, RMS<0.5 nm, MTI Co.). Then, the OrmoStamp® working stamp (a positive replica of the master mold (n-$SiO_2$)) was placed onto the vacuum-dried spin cast flat f-PVP thin films in the nanoimprinting system (NX2000, Nanonex Inc.) at constant/continuous heat/temperature (150° C.) and pressure (100 PSI) for 2 min to fabricate nanogrooved PVP:HDA (referred to as n-PVP). The n-PVP thin films were then cured at 105° C. for 1 hour (h) to promote the crosslinking reaction. Nanostructures on each substrate were confirmed by obtaining tapping mode AFM topographic images using an Asylum MFP-3D Standard System in air.

Deposition of Interfacial Layer.

The crosslinked f-PVP and n-PVP thin films were loaded in the plasma-enhanced FlexAL Atomic Layer Deposition (ALD) system (Oxford Instruments Inc.) for the deposition of $SiO_2$ at 120° C. with a desired thickness from 0.5 nm to 10 nm. The $SiO_2$ thickness was measured by using a Woolam Spectroscopic Ellipsometer (M2000DI VASE, J. A. Woolam Co.) for simultaneously deposited $SiO_2$ thin films on Si substrates during the ALD process.

Device Fabrication and Characterization.

The OFETs were fabricated onto ultrasmooth glass and polyimide (Neopulim L-3450, 100 μm in thickness, Mitsubishi Gas Chemical Company Inc.) substrates with the BGBC geometry. The dielectric layers (f-PVP, n-PVP, f-PVP/$SiO_2$, and n-PVP/$SiO_2$) were prepared on top of Ni (10 nm)/Au (100 nm) gate electrodes on the ultrasmooth glass substrates as described above, with a thickness of approximately 400 nm and measured capacitance values of approximately $1.0 \times 10^{-4}$ F m$^{-2}$ (Supplementary Fig. S9 in the Supplementary Information[31]). The capacitance data were collected by using a 4192A LF impedance analyzer (Hewlett Packard Inc.). The Ni (5 nm)/Au (50 nm) source and drain electrodes were patterned on the dielectrics through the Si shadow mask. All metal electrodes were deposited by electron beam evaporation at $7 \times 10^{-7}$ Torr. After ultraviolet/ozone treatment of the $SiO_2$-covered dielectrics (f-PVP/$SiO_2$ and n-PVP/$SiO_2$) for 10 min, the substrates were passivated with the n-DTS (Gelest Inc.) in toluene solution (1% by volume) at 80° C. for 20 min in air. The PCDTPT (1-Material Inc.) was then cast from a chlorobenzene solution (0.25 mg mL$^{-1}$) for approximately 5 h in the sandwich casting geometry in a nitrogen filled glove box[14]. The devices were then cured at 190° C. for 3 min prior to measurements, and were tested using a probe station (Signatone Co.) in a nitrogen filled glove box. Data were collected by a Keithley 4200 system.

GIWAXS Measurement.

The samples were prepared onto the n-PVP and n-PVP/$SiO_2$ thin films on native oxide Si substrates. GIWAXS measurements were performed at beamline 11-3 at the Stanford Synchrotron Radiation Lightsource (SSRL) with an X-ray wavelength of 0.9752 Å, at a 400 mm sample to detector distance. Samples were scanned for 300 s in a He environment at an incident angle of 0.10°. The measurements were calibrated using a LaB6 standard.

Process Steps

Figure 5:
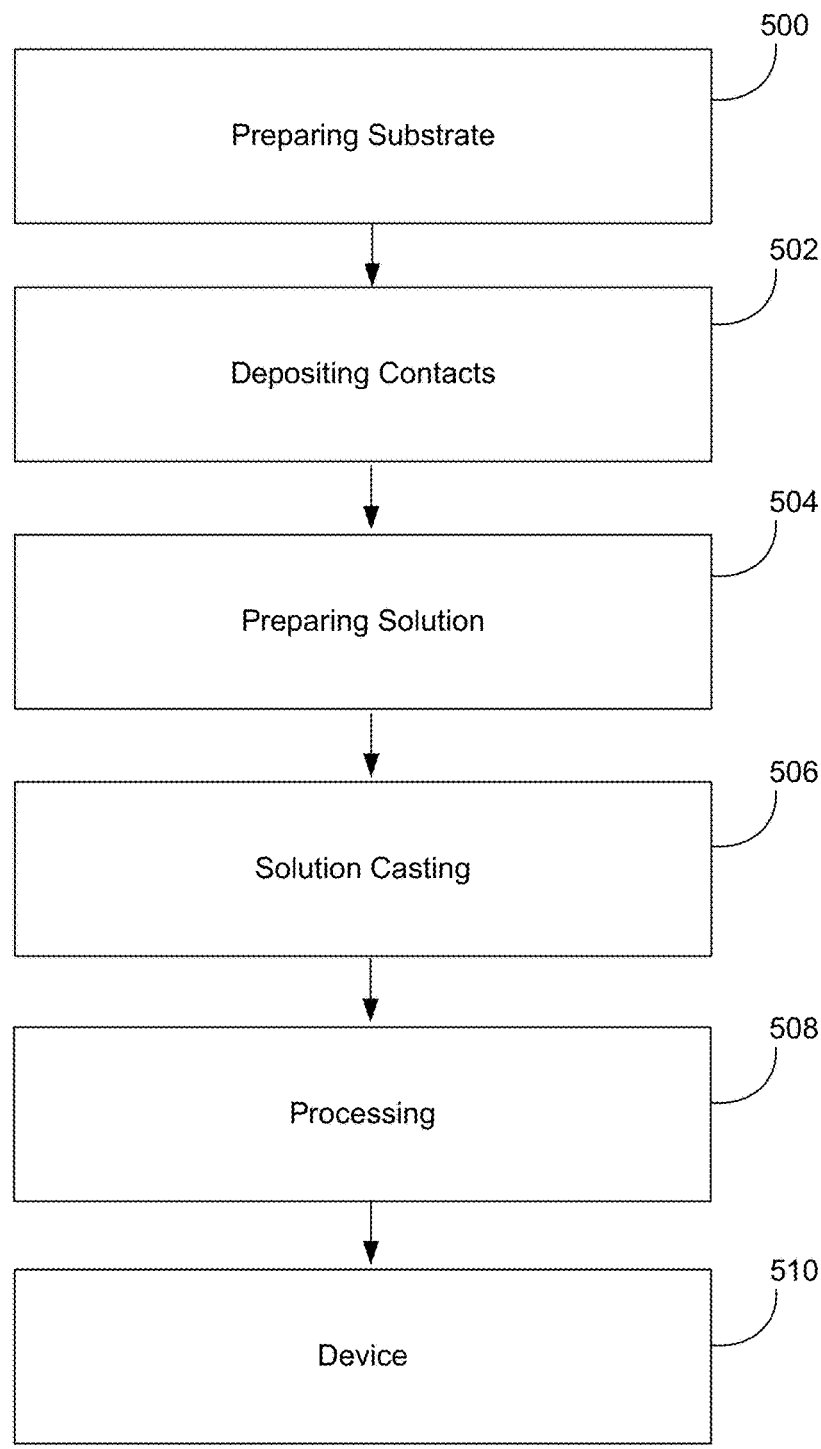
FIG. 5 illustrates a method of fabricating a device, according to one or more embodiments of the invention.

FIG. 5 is a flowchart illustrating a method for fabricating a semiconducting polymer or organic device. The method can comprise the following steps.

Block 500 represents obtaining/providing and/or preparing a (e.g., flexible and/or swellable) substrate. The flexible substrate can be plastic, polymer, metal, or glass substrate. In one or more embodiments, the flexible substrate is at least one film or foil selected from a polyimide film, a polyether ether ketone (PEEK) film, a polyethylene terephthalate (PET) film, a polyethylene naphthalate (PEN) film, a polytetrafluoroethylene (PTFE) film, a polyester film, a metal foil, a flexible glass film, and a hybrid glass film.

The step can comprise forming a coating (e.g., a dielectric coating) or one or more dielectric layers, on the substrate. The dielectric layers can comprise silicon dioxide, a polymer (e.g., PVP) dielectric layer, or multiple dielectric layers (e.g., a bilayer dielectric). The dielectric layers can be solution coated on the substrate. A single polymer dielectric layer may be preferred in some embodiments (for easier processing, more flexibility). In one embodiment, the dielectric layers can form a polymer/SiO$_2$ bilayer. In another embodiment, the dielectric layers form a polymer dielectric/SiO$_2$/SAM multilayer with the SiO$_2$ on the polymer and the alkylsilane or arylsilane Self Assembled Monolayer (SAM) layer on the SiO$_2$. In another embodiment, the dielectric layers form a SiO$_2$/SAM bilayer with the alkylsilane or arylsilane SAM layer on the SiO$_2$. Various functional groups may be attached to the end of the alkyl groups to modify the surface property of the SAM layer.

The thickness of the coating/dielectric (e.g., SiO$_2$) may be adjusted/selected. For example, the thickness may be adjusted (e.g., made sufficiently thin) depending on the composition of the dielectric layers and the flexibility requirement. For example, in one embodiment, the dielectric layer might not include a polymer dielectric layer and still be flexible.

The dielectric or coating can be structured or patterned to form one or more grooves or structures (such as nanogrooves/nanostructures, e.g., having a depth of 6 nanometers or less and/or a width of 100 nm or less) in the dielectric.

In one or more embodiments, the nanogrooves are formed by nano-imprinting (i.e., the nanogrooves are nanoimprinted into the dielectric or substrate). For example, the step of fabricating the dielectric layers can comprise nano-imprinting a first dielectric layer (e.g., PVP) deposited on the substrate; and depositing a second dielectric layer on the nanoimprinted first dielectric layer, wherein a thickness of the second dielectric layer comprising SiO$_2$ is adjusted.

Block 502 represents forming/depositing contacts or electrodes (p-type, n-type contacts, gate, source, and drain contacts) on the substrate. The source and drain contacts can comprise gold, silver, silver oxide, nickel, nickel oxide (NiOx), molybdenum, and/or molybdenum oxide, for example. The source and drain contacts of the OFETs can further comprise a metal oxide electron blocking layer, wherein the metal can be, but is not limited to nickel, silver or molybdenum. The gate contact (gate electrode) can be a thin metal layer, for example, an aluminum layer, a copper layer, a silver layer, a silver paste layer, a gold layer or a Ni/Au bilayer, or the gate contact can be a thin Indium Tin Oxide (ITO) layer, a thin fluorine doped tin oxide (FTO) layer, a thin graphene layer, a thin graphite layer, or a thin PEDOT:PSS layer. The thickness of the gate electrode may be adjusted (e.g., made sufficiently thin) depending on the flexibility requirement.

The dielectric layers deposited in Block 500 can comprise the gate dielectric (e.g., silicon dioxide). In one or more embodiments, the gate metal is deposited on the substrate, the dielectric is deposited on the gate metal surface of the substrate to form a gate dielectric, and source and drain contacts are deposited on the dielectric.

Block 504 represents preparing/obtaining a solution comprising one or more semiconducting polymers. The semiconducting polymers can include semiconducting polymers known in the art or described in one or more of the references cross-referenced herein.

One or more examples of the semiconducting polymers include, but are not limited to, a copolymer with donor and acceptor repeating units.

In one or more embodiments, the semiconducting polymers comprise a (e.g., regioregular) conjugated main chain section, said (e.g., regioregular) conjugated main chain section having a repeat unit that comprises a pyridine of the structure:

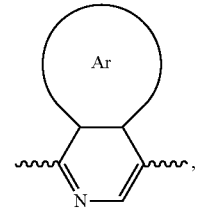

wherein Ar is a substituted or non-substituted aromatic functional group, or Ar is nothing and the valence of the pyridine ring is completed with hydrogen. In one or more embodiments, the pyridine is regioregularly arranged along the conjugated main chain section.

In one or more examples, the pyridine unit has the structure:

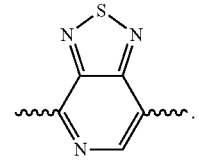

In one or more examples, the repeat unit further comprises a dithiophene of the structure:

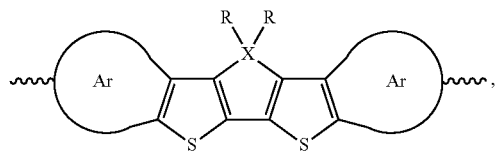

wherein the dithiophene is connected to the pyridine unit (e.g., the pyridine unit having any of the structures above), each Ar is independently a substituted or non-substituted aromatic functional group, or each Ar is independently nothing and the valence of its respective thiophene ring is completed with hydrogen, each R is independently hydrogen or a substituted or non-substituted alkyl, aryl or alkoxy chain; and X is C, Si, Ge, N or P. In some embodiments, the R groups can be the same. In the dithiophene, the R comprising the substituted or non-substituted alkyl, aryl or alkoxy chain can be a $C_6$-$C_{30}$ substituted or non-substituted alkyl or alkoxy chain, —$(CH_2CH_2O)n$ (n=2~20), $C_6H_5$, —$C_nF_{(2n+1)}$ (n=2~20), —$(CH_2)_nN(CH_3)_3Br$ (n=2~20), 2-ethylhexyl, $PhC_mH_{2m+1}$ (m=1-20), —$(CH_2)_nN(C_2H_5)_2$ (n=2~20), —$(CH_2)_nSi(C_mH_{2m+1})_3$ (m, n=1 to 20), or —$(CH_2)_nSi(OSi(CmH_{2m+1})_3)_x(C_pH_{2p+1})_y$ (m, n, p=1 to 20, x+y=3). Examples of dithiophene units include those illustrated in Table B (FIG. 30B) in U.S. Utility patent application Ser. No. 14/426,467, filed on Mar. 6, 2015, by Hsing-Rong Tseng, Lei Ying, Ben B. Y. Hsu, Christopher J. Takacs, and Guillermo C. Bazan, entitled "FIELD-EFFECT TRANSISTORS BASED ON MACROSCOPICALLY ORIENTED POLYMERS,".

For example, the dithiophene unit can comprise:

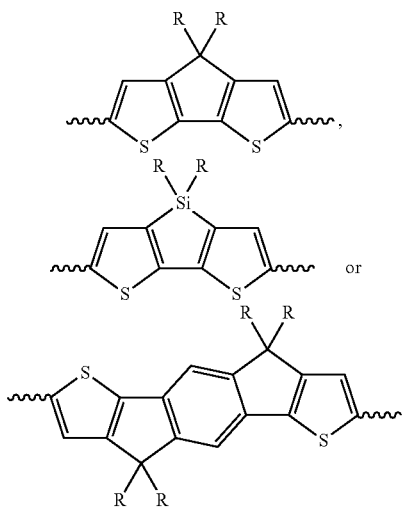

In one or more embodiments, the semiconductor polymers comprise fluorinated conjugated polymer chains (e.g., the semiconducting polymer can have fluoro functionality such as an acceptor structure including a regioregular fluorophenyl unit). For example, the semiconducting polymers can comprise polymer chains having a backbone including an aromatic ring, the aromatic ring comprising a side group (e.g., fluorine) having reduced susceptibility to oxidization as compared to a pyridine ring. In one or more examples, the semiconducting polymers comprise a (e.g., regioregular) conjugated main chain section, the (e.g., regioregular) conjugated main chain section having a repeat unit that comprises a compound of the structure:

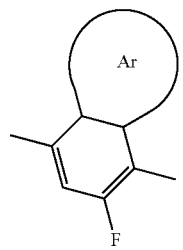

wherein Ar is a substituted or non-substituted aromatic functional group, or Ar is nothing and the valence of the ring comprising fluorine (F) is completed with hydrogen. In one or more embodiments, the ring comprising F is regioregularly arranged along the conjugated main chain section.

For example, the ring comprising the fluorine can have the structure:

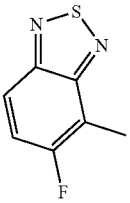

Further examples of semiconducting polymers (including, e.g., PCDTFBT) are described and can be fabricated according to the compositions and methods described in U.S. Provisional Patent Application No. 62/263,058, filed Dec. 4, 2015, by Byoung Hoon Lee, Ben B. Y. Hsu, Chan Luo, Ming Wang, Guillermo Bazan, and Alan J. Heeger, entitled "SEMICONDUCTING POLYMERS WITH MOBILITY APPROACHING ONE HUNDRED SQUARE CENTIMETERS PER VOLT PER SECOND,", which application is incorporated by reference herein (see e.g., FIG. 6 and FIG. 7 and related text of U.S. Provisional Application No. 62/263,058).

The semiconducting polymers (e.g., PCDTFBT) can be fabricated following the method(s) described in U.S. Provisional Patent Application No. 62/253,975, filed Nov. 11, 2015, by Ming Wang and Guillermo Bazan, entitled "FLUORINE SUBSTITUTION INFLUENCE ON BENZO[2,1,3] THIODIAZOLE BASED POLYMERS FOR FIELD-EFFECT TRANSISTOR APPLICATIONS,", which application is incorporated by reference herein.

Further information on the donor and acceptor structures comprising fluorine that can be used can be found in the following U.S. Provisional Patent Applications which are incorporated by reference herein: U.S. Provisional Patent Application No. 62/276,145, filed Jan. 7, 2016, by Michael J. Ford and Guillermo Bazan, entitled "STABLE ORGANIC FIELD-EFFECT TRANSISTORS BY INCORPORATING AN ELECTRON-ACCEPTING MOLECULE,"; U.S. Provisional Patent Application No. 62/276,145 and U.S. Provisional Patent Application No. 62/327,311, filed Apr. 25, 2016, by Guillermo Bazan and Ming Wang, entitled "NOVEL WEAK DONOR-ACCEPTOR CONJUGATED COPOLYMERS FOR FIELD-EFFECT TRANSISTOR APPLICATIONS,".

In one or more further examples, the semiconducting polymers comprise a fluorophenylene unit as an acceptor, the at least one fluorophenylene unit selected from:

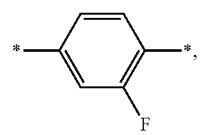

2-fluoro-1,4-phenylene

-continued

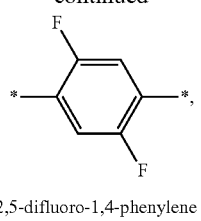

2,5-difluoro-1,4-phenylene

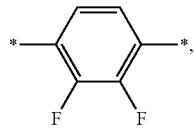

2,3-difluoro-1,4-phenylene

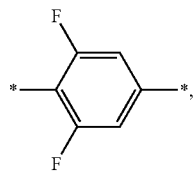

2,6-difluoro-1,4-phenylene

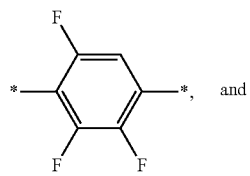

2,3,5-trifluoro-1,4-phenylene

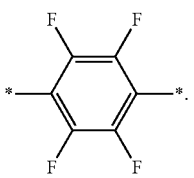

2,3,5,6-tetrafluoro-1,4-phenylene

The fluorinated conjugated polymer chains can further comprise the dithiophene described above, e.g., thereby comprising regioregular structures such as Ser. No. 62/327,311:

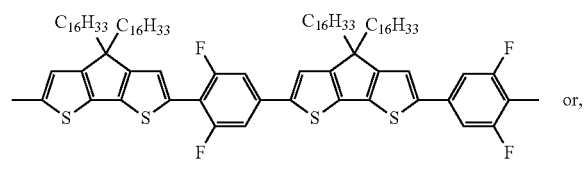

or,

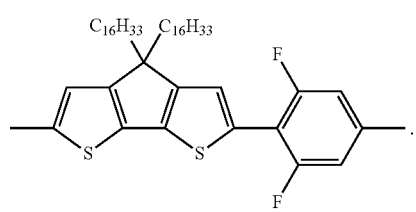

or non-regioregular structures such as:

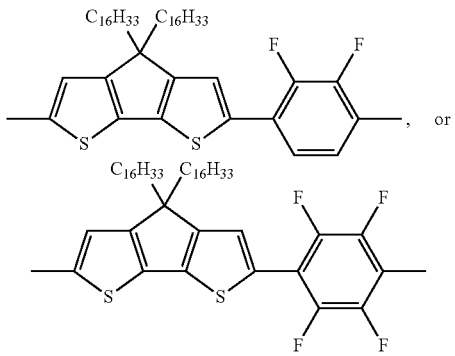

wherein the $C_{16}H_{33}$ can be other R as described above.

In one or more further embodiments of any of the examples given above, the semiconducting polymers can comprise acceptor units chosen from the following (as described in U.S. Provisional Patent Application No. 62/338,866, filed May 19, 2016, by Michael J. Ford, Hengbin Wang, and Guillermo Bazan, entitled "ORGANIC SEMICONDUCTOR SOLUTION BLENDS FOR SWITCHING AMBIPOLAR TRANSPORT TO N-TYPE TRANSPORT,":

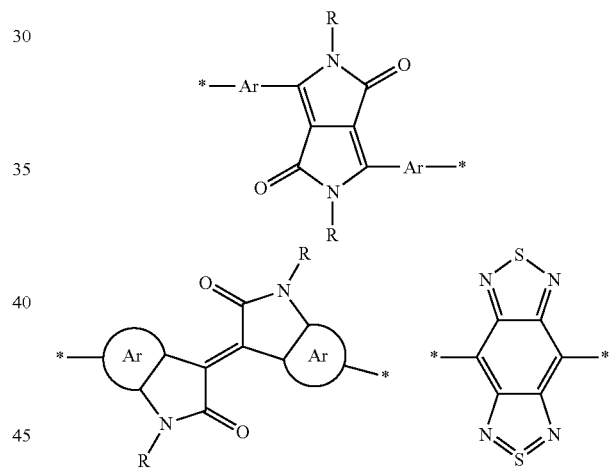

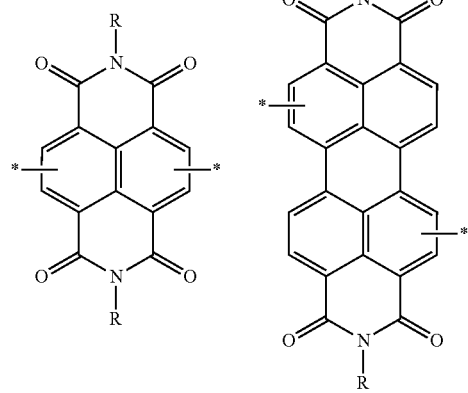

wherein each Ar is independently a substituted or non-substituted aromatic functional group, or each Ar is independently nothing and the valence is completed with hydrogen, each R is independently hydrogen or a substituted or non-substituted alkyl, aryl or alkoxy chain.

In typical embodiments of the invention, the semiconducting polymer comprises a regioregular conjugated main chain section having n=5-5000 (n is an integer) or more contiguous repeat units (e.g., having the alternating structure D-A-D-A, [D-A]$_n$, or [D-A-D-A]$_n$, where D is a donor unit and A is an acceptor unit). In some embodiments, the number of repeat units is in the range of 10-40 repeats. The regioregularity of the conjugated main chain section can be 95% or greater, for example.

Additives and additional compositions may be added to the solution, e.g., to form a blend, e.g., as described in the U.S. Provisional Patent Application No. 62/388,866 and U.S. Provisional Patent Application No. 62/276,145 cross-referenced above.

Block 506 represents solution casting the semiconducting polymer (or a film of the semiconducting polymer) on the dielectric layers.

Solution casting methods include, but are not limited to, inkjet printing, bar coating, spin coating, blade coating, spray coating, roll coating, dip coating, free span coating, dye coating, screen printing, and drop casting.

In one or more embodiments, the dielectric or dielectric layers comprise one or more (e.g., uniaxial) nanogrooves and the semiconducting polymers are oriented by the one or more nanogrooves.

The structure (e.g., nanogrooves) of dielectric layer can orient the semiconducting polymers comprising polymer chains, e.g., so that polymer chains each have their backbone substantially parallel to a longitudinal axis of at least one of the nanogrooves, and the conduction between the source contact and the drain contact is along the backbones/main chain axes in a direction of the longitudinal axis. The source and drain can be positioned such that a minimum distance between the source contact and drain contact is substantially parallel to the longitudinal axis of the nanogrooves.

The nanogrooves can provide nucleation sites for growth of the polymer chains within the solution so that one or more of the polymer chains seed and stack within one or more of the nanogrooves. The semiconducting polymers/polymer chains are typically disposed in one or more fibers, wherein the main-chain axes of the polymer chains are aligned along the long-axis of the fiber while π-π stacking of the polymer chains is in a direction along the short-axis of the fiber.

The dielectric layers can reduce swelling of the one or more nanogrooves resulting from the solution casting.

Block 508 represents further processing the solution cast on the dielectric layers. The step can comprise annealing/curing the solution, or allowing the solution to dry into a film.

Block 510 represents the end result, a composition of matter and/or organic device (e.g. photovoltaic cell, light emitting device, such as an organic light emitting diode, or transistor, such as an OFET) comprising one or more semiconducting polymers processed from a solution cast on one or more (e.g., flexible) dielectric layers of a (e.g., flexible) substrate; and electrical contacts to the semiconducting polymers. The semiconducting polymers can form a channel of the device comprising an organic field effect transistor. For example, the method can form a source contact and a drain contact (e.g., ohmic contact) to the semiconducting polymers, wherein the source contact and the drain contact are separated by a length of a channel comprising the one or more semiconducting polymers, the semiconducting polymers each having a main chain axis (e.g., uniaxially) aligned with (e.g., an alignment direction in) the channel; and depositing a gate contact, wherein dielectric (e.g., gate dielectric) is between the gate contact and the semiconducting polymers.

Embodiments of the present invention are not limited to the particular sequence of depositing the source, drain, and gate contacts. For example, OFETs according to one or more embodiments of the present invention can be fabricated in a bottom gate & top contact geometry, bottom gate & bottom contact geometry, top gate & bottom contact geometry, and top gate & top contact geometry[32].

In one or more embodiments, the OFET can comprise means (e.g., nanogrooves or statutory equivalents thereof) for aligning the main chain axes to the channel. For example, the means can align the main chain axes to an imaginary line bounded by the source and the drain or the means can align the main chain axes to an alignment direction in the channel.

In other embodiments, means for aligning the semiconducting polymers comprises a fabrication method, including, but not limited to, blade coating, dip coating, and bar coating (or statutory equivalents thereof) of the semiconducting polymers on dielectric/substrate.

Thus, various methods can be used to achieve the desired alignment or directed self assembly of the semiconducting polymers. In one or more embodiments, alignment is such that conduction between the source contact and the drain contact is predominantly along the backbones/main chain axes, although charge hopping between adjacent polymers in a fiber bundle is also possible.

Figure 3G:
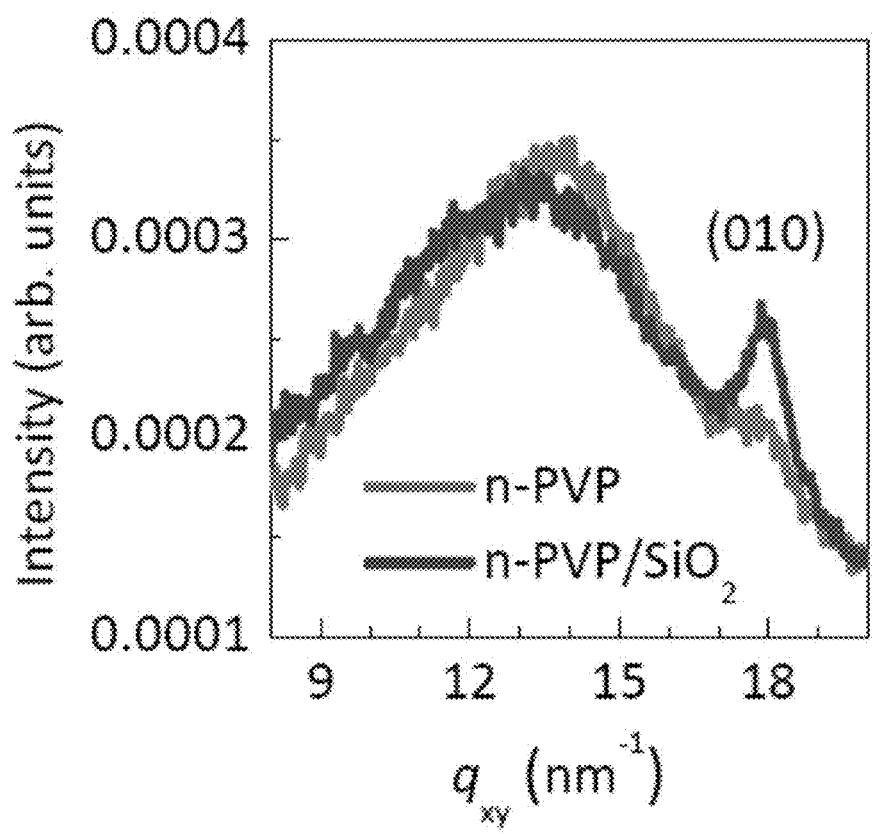
Figure 3I:
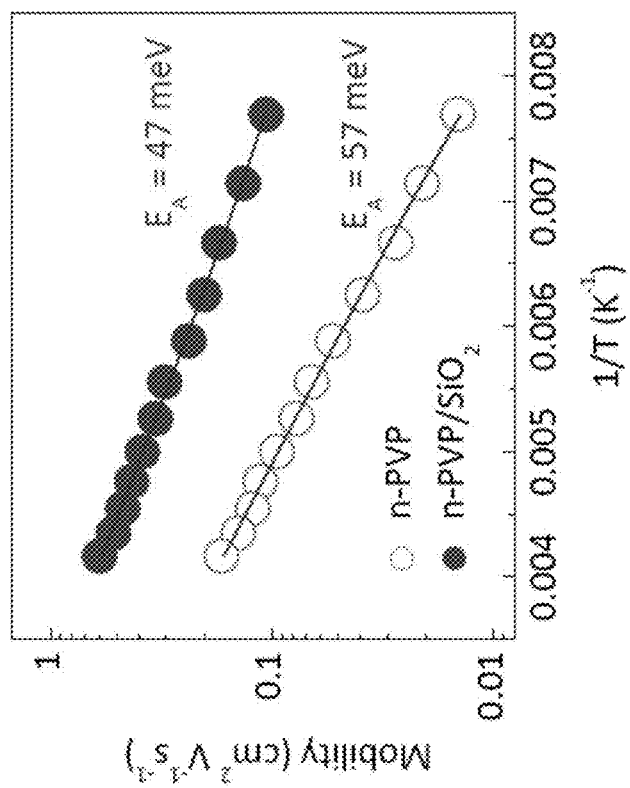
Figure 3H:
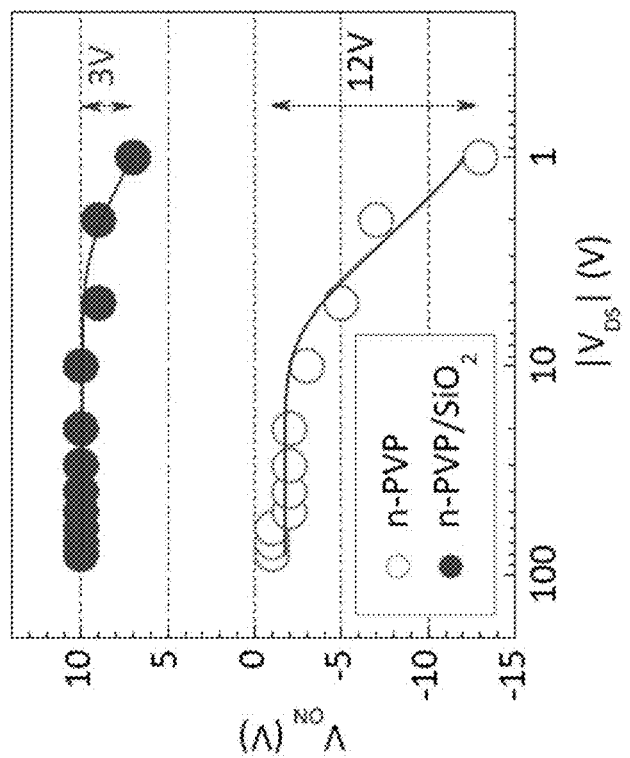

In one or more embodiments, the fabrication (including the semiconductor polymers' alignment and composition, the dielectric structure and composition, the substrate composition, and the composition(s) and structure(s) of the electrodes, as discussed in the sections above) are such that:

devices with more dielectric layers and comprising nanogrooves increase mobility compared to devices with less dielectric layers;

nanogrooves improve device mobility when dielectric layers are otherwise the same (e.g., n-PVP/SiO$_2$ can increase mobility as compared to f-PVP/SiO$_2$); and/or the one or more dielectric layers increase mobility of the semiconducting polymers and/or alignment of the semiconducting polymers with one or more of the nanogrooves, as compared to the mobility and/or alignment of the semiconducting polymer processed using the solution casting on the nanogrooves on the substrate without the one or more dielectric layers; and/or the one or more dielectric layers increase mobility of the semiconducting polymers and/or alignment of the semiconducting polymers with one or more of the nanogrooves, as compared to the mobility and/or alignment of the semiconducting polymer processed using the solution casting on the one or more dielectric layers without nanogrooves; and/or a film/OFET comprising the semiconducting polymers has the field effect saturation hole mobility of at least 11.0 cm$^2$ V$^{-1}$ s$^{-1}$—for example, the dielectric layers can increase the mobility by a factor of at least 10; and/or a film/OFET comprising the semiconducting polymers has a mobility (e.g., field effect saturation mobility) in a range of 11.0 cm$^2$ V$^{-1}$ s$^{-1}$-200 cm$^2$ V$^{-1}$ s$^{-1}$, e.g., for a source drain voltage in a range of −80 V to −1V and a gate-source voltage in a range of −10V to +10V; and/or a mobility (e.g., field effect saturation hole mobility) of the film/OFET changes by 10% or less under (e.g., 1000 cycles of) tensile and/or compressive bending of the substrate with a bending distance down to 5 mm or down to 4 mm (or a bending radius down to/as small as 4 mm or 5 mm); and/or the field effect transistor/OFET has at least four times smaller turn on voltage ($V_{ON}$) shift as compared to the device without the dielectric layers, when a source-drain bias ($V_{DS}$) is varied from −80 V to −1 V; and/or the π-π stacking of the semiconducting polymers is characterized by a peak having a full width at half maximum (FWHM) of 2 nm$^{-1}$ or less, as measured by grazing incidence wide-angle X-ray scattering (GI-WAXS) (see for example, the FWHM of the (010) peak in FIG. 3g having a FWHM of 2 nm$^{-1}$; this FWHM could be reduced with further optimization); and/or the semiconducting polymers/polymer chains are disposed in one or more fibers, e.g., wherein the fibers are continuously aligned with an alignment direction in the channel (e.g., a length of the channel) for a distance including at least 2 micrometers (e.g., at least 8 micrometers, see FIG. 3(b)); for example, one or more of the nanogrooves or structures in the substrate/dielectric can contact and align one or more of the fibers such that the fibers are continuously aligned with (and/or at least partially lie within) one or more of the nanogrooves, e.g., for a length of the nanogrooves of at least 2 micrometers (e.g., at least 8 micrometers); and/or the semiconducting polymers/polymer chains are disposed/stacked in one or more fibers, wherein the width of an individual fiber is about 2-3 nm, and fibers on the nanostructured/nanogrooved substrate are disposed in fiber bundles having a width of 50~100 nm or at least 50 nm (as compared to fiber bundles having a width between 30~40 nm when fabricated on a non-structured substrate); and/or the semiconducting polymers form crystalline regions (and amorphous/non-crystalline regions) in a film; and/or a tilt, S, of the main-chain axis relative to a normal of the substrate is less than or equal to −0.35 and/or an orientation, η, of the polymer main-chain axis relative to the alignment direction is greater than or equal to 0.96.

Thus, it is unexpectedly found that a thickness of dielectric such as silicon dioxide can be deposited on a flexible substrate, and semiconducting polymers can be deposited on the dielectric, in order to achieve a flexible OFET. The combination of flexibility and alignment, represented by the results described herein and achieved by one or more embodiments of the present invention, is unexpected and surprising at least because silicon dioxide has been known to be a brittle material[15].

Further information on one or more embodiments of the present invention can be found in reference[33].

REFERENCES

The following references are incorporated by reference herein.

1 *Organic field-effect transistors*. Zhenan Bao, Jason Locklin edn, (CRC Press, 2007).
2 Yi, H. T., Payne, M. M., Anthony, J. E. & Podzorov, V. Ultra-flexible solution-processed organic field-effect transistors. *Nat. Commun.* 3, 1259 (2012).
3 *Large area and flexible electronics*. Mario Caironi, Yong-Young Noh edn, (John Wiley & Sons, 2015).
4 Schwartz, G. et al. Flexible polymer transistors with high pressure sensitivity for application in electronic skin and health monitoring. *Nat. Commun.* 4, 1859 (2013).
5 Wu, X. et al. Thermally stable, biocompatible, and flexible organic field-effect transistors and their application in temperature sensing arrays for artificial skin. *Adv. Funct. Mater.* 25, 2138-2146 (2015).
6 Yoon, M.-H., Yan, H., Facchetti, A. & Marks, T. J. Low-voltage organic field-effect transistors and inverters enabled by ultrathin cross-linked polymers as gate dielectrics. *J. Am. Chem. Soc.* 127, 10388-10395 (2005).
7 Lee, E. K. et al. Photo-crosslinkable polymer gate dielectrics for hysteresis-free organic field-effect transistors with high solvent resistance. *RSC Adv.* 4, 293-300 (2014).
8 Verploegen, E. et al. Swelling of polymer dielectric thin films for organic-transistor-based aqueous sensing applications. *Chem. Mater.* 25, 5018-5022 (2013).
9 Li, J. et al. A stable solution-processed polymer semiconductor with record high-mobility for printed transistors. *Sci. Rep.* 2 (2012).
10 *Conjugated polymers: Theory, synthesis, properties, and characterization*. Terje A. Skotheim, John R. Reynolds edn, (CRC Press, 2006).
11 Noriega, R. et al. A general relationship between disorder, aggregation and charge transport in conjugated polymers. *Nat. Mater.* 12, 1038-1044 (2013).
12 Tseng, H.-R. et al. High-mobility field-effect transistors fabricated with macroscopic aligned semiconducting polymers. *Adv. Mater.* 26, 2993-2998 (2014).
13 Tseng, H.-R. et al. High mobility field effect transistors based on macroscopically oriented regioregular copolymers. *Nano Lett.* 12, 6353-6357 (2012).
14 Luo, C. et al. General strategy for self-assembly of highly oriented nanocrystalline semiconducting polymers with high mobility. *Nano Lett.* 14, 2764-2771 (2014).
15 Sharpe, W. N., Jr. et al. Strain measurements of silicon dioxide microspecimens by digital imaging processing. *Exp Mech* 47, 649-658 (2007).
16 Guo, L. J. Nanoimprint lithography: Methods and material requirements. *Adv. Mater.* 19, 495-513 (2007).
17 Andrea Cattoni et al. Soft uv nanoimprint lithography: A versatile tool for nanostructuration at the 20 nm scale. 10.5772/21874 (2011).
18 Roberts, M. E. et al. Cross-linked polymer gate dielectric films for low-voltage organic transistors. *Chem. Mater.* 21, 2292-2299 (2009).
19 Yuan, Y. et al. Ultra-high mobility transparent organic thin film transistors grown by an off-centre spin-coating method. *Nat Commun* 5 (2014).
20 Lan, H. Soft uv nanoimprint lithography and its applications. 45203 (2013).
21 Kim, K.-h. et al. in *Ekc2008 proceedings of the eu-korea conference on science and technology* Vol. 124 *Springer proceedings in physics* (ed Yoo) Ch. 24, 229-237 (Springer Berlin Heidelberg, 2008).
22 Perez, L. A. et al. Effect of backbone regioregularity on the structure and orientation of a donor-acceptor semiconducting copolymer. *Macromolecules* 47, 1403-1410 (2014).
23 Horowitz, G. Organic field-effect transistors. *Adv. Mater.* 10, 365-377 (1998).
24 Letizia, J. A. et al. Variable temperature mobility analysis of n-channel, p-channel, and ambipolar organic field-effect transistors. *Adv. Funct. Mater.* 20, 50-58 (2010).
25 Park, S. et al. Flexible molecular-scale electronic devices. *Nat. Nanotechnol.* 7, 438-442 (2012).

26. Yoon, J.-Y. et al. Enhanced performance of solution-processed organic thin-film transistors with a low-temperature-annealed alumina interlayer between the polyimide gate insulator and the semiconductor. *ACS Appl. Mater. Interfaces* 5, 5149-5155 (2013).

27. Jang, K.-S. et al. Surface modification of a polyimide gate insulator with an yttrium oxide interlayer for aqueous-solution-processed zno thin-film transistors. *Langmuir* 29, 7143-7150 (2013).

28. Machado, W. S. & Hummelgen, I. A. Low-voltage poly(3-hexylthiophene)/poly(vinyl alcohol) field-effect transistor and inverter. *Electron Devices, IEEE Transactions on* 59, 1529-1533 (2012).

29. Noh, Y.-Y. & Sirringhaus, H. Ultra-thin polymer gate dielectrics for top-gate polymer field-effect transistors. *Org. Electron.* 10, 174-180 (2009).

30. Jang, J. et al. Hysteresis-free organic field-effect transistors and inverters using photocrosslinkable poly(vinyl cinnamate) as a gate dielectric. *Appl. Phys. Lett.* 92, 143306 (2008).

31. "Supplementary Information for Flexible organic transistors with controlled nanomorphology," by Byoung Hoon Lee, Ben B. Y. Hsu, Shrayesh N. Patel, John Labram, Chan Luo, Guillermo C. Bazan, and Alan J. Heeger (Appendix to the specification filed in U.S. Provisional Application No. 62/193,909).

32. DiBenedetto et. al., Molecular Self-Assembled Monolayers and Multilayers for Organic and Unconventional Inorganic Thin-Film Transistor Applications, Adv. Mater. 2009, 21, 1407-1433 DOI 10.1002/adma.200803267.

33. Byoung Hoon Lee et. al., Flexible Organic Transistors with Controlled Nanomorphology, *Nano Lett.*, 2016, 16 (1), pp 314-319 and associated Supplementary Information.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An organic field effect transistor (OFET), comprising:
   a flexible structure, including:
   a substrate;
   a channel on or above the substrate, the channel comprising semiconducting polymers disposed in a stack, the semiconducting polymers each comprising a main chain axis aligned within a space having a width of 100 nanometers (nm) along an alignment direction in the channel, the alignment direction defined by a length of the space in a direction of a length of the channel;
   a source contact and a drain contact making contact to the semiconducting polymers, the source contact and the drain contact separated by the length of the channel;
   a gate contact; and
   a dielectric between the gate contact and the semiconducting polymers.

2. The OFET of claim 1, wherein the substrate is a polymer substrate, metal substrate, or glass substrate.

3. The OFET of claim 1, wherein the substrate is at least one film or foil selected from a polyimide film, a polyether ether ketone (PEEK) film, a polyethylene terephthalate (PET) film, a polyethylene naphthalate (PEN) film, a polytetrafluoroethylene (PTFE) film, a polyester film, a metal foil, a flexible glass film, and a hybrid glass film.

4. The OFET of claim 1, wherein the dielectric comprises one or more nanogrooves orienting the main chain axes of one or more of the semiconducting polymers along an axis direction of the nanogrooves parallel to the alignment direction.

5. The OFET of claim 4, wherein the dielectric has a composition and structure that increases mobility of the semiconducting polymers, as compared to the dielectric without the nanogrooves.

6. The OFET of claim 4, wherein the nanogrooves have a depth of 6 nanometers (nm) or less and a width of 100 nm or less.

7. The OFET of claim 4, wherein the nanogrooves are nanoimprinted into the dielectric or the substrate and the semiconducting polymers are cast from a solution onto the dielectric.

8. The OFET of claim 1, wherein:
   the semiconducting polymers are disposed in one or more fibers, and
   the fibers are continuously aligned with the alignment direction for a distance including at least 2 micrometers.

9. The OFET of claim 8, wherein:
   one or more of the dielectric layers comprise one or more nanogrooves orienting the main chain axes along an axis direction of the nanogrooves parallel to the alignment direction, and
   the fibers are continuously aligned with the axis direction for a distance including at least 2 micrometers.

10. The OFET of claim 1, wherein the dielectric comprises a thickness of silicon dioxide.

11. The OFET of claim 10, wherein the silicon dioxide is on a surface of poly(4-vinylphenol) (PVP), thereby forming the dielectric comprising a dielectric bilayer of $SiO_2$ on PVP.

12. The OFET of claim 1, wherein the dielectric is a single polymer dielectric layer.

13. The OFET of claim 1, wherein the dielectric comprises a bilayer comprising $SiO_2$ on a polymer dielectric.

14. The OFET of claim 1, wherein the dielectric comprises a multilayer comprising $SiO_2$ on a polymer and an alkylsilane or arylsilane SAM layer on the $SiO_2$.

15. The OFET of claim 1, wherein the dielectric comprises a bilayer comprising an alkylsilane or arylsilane SAM layer on $SiO_2$.

16. The OFET of claim 1, wherein $\pi$-$\pi$ stacking of the semiconductor polymers is characterized by a peak having a full width at half maximum of 2 $nm^{-1}$ or less, as measured by grazing incidence wide-angle X-ray scattering (GI-WAXS).

17. The OFET of claim 1, wherein the dielectric comprises a composition and thickness wherein the OFET has a field effect saturation hole mobility that changes by 10% or less under tensile and/or compressive bending of the substrate with a bending radius down to 4 mm.

18. The OFET of claim 1, wherein the semiconductor polymers are aligned and the dielectric has a composition and thickness such that the OFET has at least four times smaller turn on voltage ($V_{ON}$) shift as compared to the OFET without the dielectric layers, when a source-drain bias ($V_{DS}$) is varied from −80 V to −1 V.

19. The OFET of claim 1, wherein the channel has a mobility in a range of 11.0 $cm^2 V^{-1} s^{-1}$–200 $cm^2 V^{-1} s^{-1}$ for a source drain voltage in a range of −80 V to −1V and a gate-source voltage in a range of −10V to +10V.

20. A method of fabricating an organic field effect transistor (OFET), comprising:
fabricating a flexible structure, including:
providing a flexible substrate;
depositing a dielectric on or above the substrate;
casting one or more semiconducting polymers from a solution onto the dielectric on or above the flexible substrate;
forming a source contact and a drain contact; and
depositing a gate contact; and
wherein the OFET comprises:
the dielectric between the gate contact and the semiconducting polymers,
the source contact and the drain contact separated by a length of a channel comprising the one or more semiconducting polymers,
the source and drain contact each making ohmic contact to the semiconducting polymers, and
the semiconducting polymers disposed in a stack, each of the semiconducting polymers having a main chain axis aligned within a space having a width of 100 nanometers (nm) along an alignment direction in the channel, the alignment direction defined by a length of the space in a direction of the length of the channel.

* * * * *